(12) United States Patent
Tachibana et al.

(10) Patent No.: US 9,046,764 B2
(45) Date of Patent: Jun. 2, 2015

(54) RESIST UNDERLAYER FILM COMPOSITION, METHOD FOR PRODUCING POLYMER FOR RESIST UNDERLAYER FILM, AND PATTERNING PROCESS USING THE RESIST UNDERLAYER FILM COMPOSITION

(71) Applicant: SHIN-ETSU CHEMICAL CO., LTD., Tokyo (JP)

(72) Inventors: Seiichiro Tachibana, Jyoetsu (JP); Daisuke Kori, Jyoetsu (JP); Tsutomu Ogihara, Jyoetsu (JP); Kazumi Noda, Jyoetsu (JP); Takeshi Kinsho, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 13/712,627

(22) Filed: Dec. 12, 2012

(65) Prior Publication Data

US 2013/0171569 A1 Jul. 4, 2013

(30) Foreign Application Priority Data

Jan. 4, 2012 (JP) ................................ 2012-000243

(51) Int. Cl.
| | |
|---|---|
| *G03F 7/09* | (2006.01) |
| *G03F 7/11* | (2006.01) |
| *G03F 7/40* | (2006.01) |
| *G03F 7/004* | (2006.01) |
| *G03F 7/075* | (2006.01) |

(52) U.S. Cl.
CPC . *G03F 7/004* (2013.01); *G03F 7/40* (2013.01); *G03F 7/0752* (2013.01); *G03F 7/11* (2013.01)

(58) Field of Classification Search
CPC .......... G03F 7/004; G03F 7/09; G03F 7/094; G03F 7/095; G03F 7/11; C08G 8/00; C08G 8/10; C08G 8/20; C08G 8/22
USPC .................. 430/270.1, 271.1, 313, 316, 927; 528/129; 524/6
See application file for complete search history.

(56) References Cited

U.S. PATENT DOCUMENTS

| | | | | | |
|---|---|---|---|---|---|
| 4,966,790 | A | * | 10/1990 | Iizuka et al. ................... | 427/386 |
| 5,185,388 | A | * | 2/1993 | Murata et al. .................. | 523/466 |
| 5,510,540 | A | * | 4/1996 | Hozumi et al. ............... | 568/640 |
| 2002/0106909 | A1 | | 8/2002 | Kato et al. | |
| 2004/0191479 | A1 | | 9/2004 | Hatakeyama et al. | |
| 2005/0255712 | A1 | | 11/2005 | Kato et al. | |
| 2005/0288396 | A1 | * | 12/2005 | Katayama et al. .......... | 523/412 |
| 2006/0019195 | A1 | | 1/2006 | Hatakeyama et al. | |
| 2007/0238300 | A1 | | 10/2007 | Ogihara et al. | |
| 2008/0085985 | A1 | * | 4/2008 | Nakamura et al. ............. | 528/25 |
| 2008/0118860 | A1 | | 5/2008 | Harada et al. | |
| 2008/0268369 | A1 | | 10/2008 | Ikezaki et al. | |
| 2009/0136869 | A1 | | 5/2009 | Ogihara et al. | |
| 2010/0239980 | A1 | | 9/2010 | Okuyama et al. | |
| 2013/0004894 | A1 | | 1/2013 | Hayashi et al. | |

FOREIGN PATENT DOCUMENTS

| | | |
|---|---|---|
| JP | A-6-118651 | 4/1994 |
| JP | A-2002-334869 | 11/2002 |
| JP | A-2004-18421 | 1/2004 |

(Continued)

OTHER PUBLICATIONS

Abe et al., "Sub-55-nm Etch Process Using Stacked-Mask Process," (2005), *Dry Process International Symposium*, pp. 11-12.

(Continued)

*Primary Examiner* — Anca Eoff
(74) *Attorney, Agent, or Firm* — Oliff PLC

(57) ABSTRACT

A resist underlayer film composition, wherein the composition contains a polymer obtained by condensation of a condensed body, the body being obtained by condensation of one or more kinds of a compound shown by the following general formula (1-1) with one or more kinds of a compound shown by the following general formula (2-3) and an equivalent body thereof, with one or more kinds of a compound shown by the following general formula (2-1), a compound shown by the following general formula (2-2), and an equivalent body thereof; a method for producing a polymer for a resist underlayer film; and a patterning process using the same.

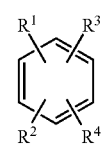

(1-1)

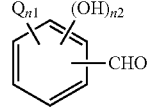

(2-1)

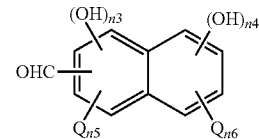

(2-2)

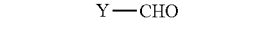

(2-3)

24 Claims, 2 Drawing Sheets

(56) References Cited

FOREIGN PATENT DOCUMENTS

| | | |
|---|---|---|
| JP | A-2004-310019 | 11/2004 |
| JP | A-2007-199653 | 8/2007 |
| JP | A-2007-302873 | 11/2007 |
| JP | A-2008-111103 | 5/2008 |
| JP | A-2009-126940 | 6/2009 |
| JP | B2-4355943 | 11/2009 |
| TW | 200617596 A | 6/2006 |
| TW | 201132621 A1 | 10/2011 |
| WO | WO 2004-066377 A1 | 8/2004 |
| WO | WO 2009/060869 A1 | 5/2009 |

OTHER PUBLICATIONS

Jun. 13, 2014 Office Action issue in Taiwanese Application No. 102100047 with partial English-language translation.

* cited by examiner

INTERMEDIATE FILM: FILM THICKNESS (NM)

SUBSTRATE REFLECTANCE (%)
☐ 0-1 ▨ 1-2 ▨ 2-3 ▨ 3-4 ▨ 4-5

US 9,046,764 B2

RESIST UNDERLAYER FILM COMPOSITION, METHOD FOR PRODUCING POLYMER FOR RESIST UNDERLAYER FILM, AND PATTERNING PROCESS USING THE RESIST UNDERLAYER FILM COMPOSITION

BACKGROUND OF THE INVENTION

1. Field of the Invention

The present invention relates to: a resist underlayer film composition effective especially as an antireflective film material used in microprocessing in manufacturing process of a semiconductor device and so on; a method for producing a polymer for a resist underlayer film composition; and a resist patterning process using the same, wherein the process is suitable for photo-exposure to a light such as a far UV beam, a KrF excimer laser beam (248 nm), an ArF excimer laser beam (193 nm), an $F_2$ laser beam (157 nm), a $Kr_2$ laser beam (146 nm), an $Ar_2$ laser beam (126 nm), a soft X-ray (EUV: 13.5 nm), an electron beam (EB), and an X-ray.

2. Description of the Related Art

As an LSI advances toward higher integration and higher processing speed in recent years, miniaturization of a pattern rule is required. In such a trend, in a lithography using a photo-exposure which is used as a general-purpose technology, various technologies are being developed how to carry out patterning finely and more precisely to a light source used therein.

Photo-exposure using a g-beam (436 nm) or an i-beam (365 nm) of a mercury lamp has been widely used as a light source for a lithography used in the resist patterning; and as a means for further miniaturization, shifting of the exposure light to a shorter wavelength was assumed to be effective. Accordingly, in mass production process of the DRAM (Dynamic Random Access Memory) with a 64 megabits, a KrF excimer laser (248 nm), a shorter wavelength than the i-beam (365 nm), was used in place of the i-beam as the exposure light source. However, in production of DRAM with integration of 1 G or higher which requires a further miniaturized process technology (processing dimension of 0.13 µm or less), a light source with further shorter wavelength is required, and thus, a lithography using especially an ArF excimer laser (193 nm) has been investigated.

In a monolayer resist method which is used as a typical resist patterning process, it is well known that pattern fall occurs during development due to surface tension of a developer if ratio of a pattern height to a pattern line width (aspect ratio) is too high. In the case of forming a pattern with a high aspect ratio on a non-planar substrate, it is known that a multilayer resist method, in which patterning is done by laminating the films having different dry etching properties, is suitable. Accordingly, what have been developed are: a two-layer process in which a resist film of a photo-sensitive silicon polymer and a underlayer film of an organic polymer mainly composed of elements of a carbon, a hydrogen, and an oxygen, such as for example, a novolak polymer, are combined (Patent Document 1, and so on); and a three-layer process in which a resist film of a photo-sensitive organic polymer used in a monolayer resist method, a middle layer film of a silicon polymer or a silicon CVD film, and a underlayer film of an organic polymer are combined (Patent Document 2, and so on).

Because patterning of the underlayer film of the above-mentioned multilayer resist methods is done by dry etching with an oxygen gas by using a silicon-containing material film which is formed immediately thereabove as a hard mask, the underlayer film of an organic polymer mainly composed of elements of a carbon, a hydrogen, and an oxygen is used; and at the same time, the underlayer film is required to have an etching resistance during the time of dry etching of a substrate to be processed, to be able to form a highly flat film on the substrate to be processed, and, depending on its use method, to have an antireflective function during photo-exposure. For example, in Patent Document 2, which describes a technology relating to a underlayer film composition for a two-layer or a three-layer process, when a underlayer film like this is used, not only the underlayer film pattern with high precision can be formed but also a high etching resistance to etching conditions of the substrate to be processed can be secured.

Here, substrate reflectance when k-value (extinction coefficient) of the resist middle layer film is changed is shown in FIG. 2.

When k-value of the resist middle layer film is made 0.2 or lower and film thickness thereof is set appropriately, sufficient antireflective effect of 1% or less can be obtained.

In FIG. 3 and FIG. 4, change of reflectance with change of film thickness of the middle layer film and of the underlayer film in the case of k-value of the underlayer film being 0.2 and 0.6, respectively, is shown. By comparison between FIG. 3 and FIG. 4, it can be seen that, with higher k-value of the resist underlayer film (in the case of 0.6 (FIG. 4)), reflectance can be suppressed to 1% or less with a thinner film. When k-value of the resist underlayer film is 0.2 (FIG. 3), to obtain reflectance of 1% in the film thickness of 250 nm, the resist middle layer film needs to be thicker. If the resist middle layer film is made thicker, load to the uppermost resist film becomes larger during the time of dry etching of the resist middle layer film so that this is not desirable. In FIG. 3 and FIG. 4, reflectance in the dry exposure with NA of the exposure equipment lens being 0.85 is shown, which suggests that reflectance of 1% or less can be obtained, independent of k-value of the underlayer film, by optimizing the n-value (refractive index), the k-value, and the film thickness of the middle layer film of the three-layer process.

On the contrary, when NA of the projection lens becomes 1.0 or more by an immersion lithography, angle of the incident light to the antireflective film becomes shallower. The antireflective film suppresses reflection not only by absorption of the film itself but also by a negating action due to the interference effect of light. The interference effect of the oblique incident light is small thereby increasing the reflectance.

Among the films in the three-layer process, it is the middle layer film that has an antireflective effect due to the interference action of a light. The underlayer film is too thick for the interference action so that there is no antireflective effect by a negating action due to the interference effect. Reflection from surface of the underlayer film needs to be suppressed, so that the k-value needs to be made less than 0.6 and the n-value near to the value of the middle layer film thereabove. If a transparency is too high due to a too small k-value, reflection from the substrate takes place; and thus, in the case that NA of an immersion photo-exposure is 1.3, the k-value is preferably in the range of about 0.25 to about 0.75, or most preferably in the range of about 0.25 to about 0.48. Target n-values of both the middle layer film and the underlayer film are near to 1.7, the n-value of the resist.

As the processed line width becomes narrower, phenomena such as wiggling and bending of the underlayer film during etching of the substrate to be processed by using the underlayer film as a mask have been reported (Non-Patent Document 1). It is generally well known that an amorphous carbon film formed by a CVD method (hereinafter, this film is referred to as "CVD-C film") can very effectively prevent wiggling from occurring because amount of hydrogen atoms therein can be made extremely small.

However, in the case of a non-planar underlayment substrate to be processed, the difference in levels needs to be made flat by the underlayer film. By making the underlayer film flat, variance in film thickness of the middle layer film and the photoresist formed thereabove can be suppressed so that a focus margin in lithography can be enlarged.

In the CVD-C film using a raw material such as a methane gas, an ethane gas, and an acetylene gas, it is difficult to fill up the difference in levels thereof to flat. On the other hand, in the case that the underlayer film is formed by a spin coating method, concavity and convexity of the substrate can be filled up.

As mentioned above, the CVD-C film is poor in filling-up of the difference in levels, and in addition, introduction of a CVD equipment is sometimes difficult due to its price and occupied footprint area. If a wiggling problem could be solved by using an underlayer film composition capable of forming a film by a spin coating method, process as well as equipment thereof could be simplified.

The underlayer film mentioned above is formed by heat treatment after spin coating (Post Application Bake, hereinafter sometimes "PAB"); and, if a body to be processed has a thermally vulnerable structure or deformation of a wafer needs to be suppressed as much as possible, this PAB temperature needs to be made low (for example, 250° C. or lower). The underlayer film becomes dense by a crosslinking reaction during PAB (for example, Patent Document 2); but if the PAB temperature is too low, this crosslinking reaction is insufficient, thereby causing such troubles as any one of reduction in film thickness due to dissolution of the underlayer film during application of a silicon-containing material film or the like on this underlayer film by spin coating and intermixing between both films near interface of them or both.

As mentioned above, a method for forming an underlayer film having n-value, k-value, and filling-up properties suitable as an antireflective film, having an excellent pattern-bend resistance without wiggling during etching, and having sufficient solvent resistance even with low PAB temperature is wanted.

CITATION LIST

Patent Literature

Patent Document 1: Japanese Patent Laic-Open Publication No. H06-118651
Patent Document 2: Japanese Patent No. 4355943

Non-Patent Literature

Non-Patent Document 1: Proc. of Symp. Dry. Process, (2005), p. 11

SUMMARY OF THE INVENTION

The present invention was made in view of the above circumstances, and has an object to provide: a resist underlayer film composition, especially for a three-layer resist process, being capable of forming an underlayer film having reduced reflectance, namely an underlayer film having desirable n-value and k-value, with excellent filling-up properties and a high pattern-bend resistance while not causing line fall or wiggling after etching of a high aspect line of especially thinner than 60 nm, and having sufficient solvent resistance even with low temperature PAB; a method for forming a polymer for a resist underlayer film; and a patterning process using the same.

To solve the problems mentioned above, the present invention provides a resist underlayer film composition, wherein the composition contains a polymer obtained by condensation of a condensed body, the body being obtained by condensation of one or more kinds of a compound shown by the following general formula (1-1) with one or more kinds of a compound shown by the following general formula (2-3) and an equivalent body thereof, with one or more kinds of a compound shown by the following general formula (2-1), a compound shown by the following general formula (2-2), and an equivalent body thereof,

(1-1)

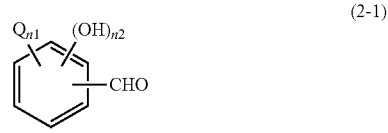

(2-1)

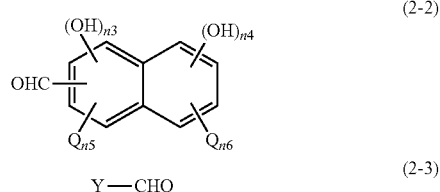

(2-2)

Y—CHO (2-3)

wherein each of $R^1$ to $R^4$ independently represents any of a hydrogen atom, a halogen atom, a hydroxyl group, an isocyanato group, a glycidyloxy group, a carboxyl group, an amino group, an alkoxyl group having 1 to 30 carbon atoms, an alkoxycarbonyl group having 1 to 30 carbon atoms, and an alkanoyloxy group having 1 to 30 carbon atoms, or an optionally substituted, saturated or unsaturated, organic group having 1 to 30 carbon atoms. In addition, two substituents arbitrarily selected from each of $R^1$ to $R^4$ within a molecule may be bonded to form a cyclic substituent group. In the general formulae (2-1) and (2-2), Q represents an optionally substituted organic group having 1 to 30 carbon atoms; and in addition, two Groups represented by Q arbitrarily selected within a molecule may be bonded to form a cyclic substituent group, n1 to n6 represent numbers of each substituent groups, while each of them represents an integer of 0 to 2. In the general formula (2-2), these numbers satisfy the relationships of $0 \le n3+n5 \le 3$, $0 \le n4+n6 \le 4$, and $0 \le n3+n4 \le 4$. In the general formula (2-3), Y represents a hydrogen atom or an optionally substituted monovalent organic group having 1 to 30 carbon atoms, wherein (2-3) is different from (2-1) and (2-2).

A resist underlayer film which is formed by using the resist underlayer film composition as mentioned above functions as an excellent antireflective film especially to an exposure light of a short wavelength, that is, the resist underlayer film is highly transparent, and has not only desirable n-value and k-value but also an excellent pattern-bend resistance during the time of substrate processing and sufficient solvent resistance even with low PAB temperature. In addition, film formation thereof can be done by a spin coating method; and thus, it has excellent filling-up properties.

Further, it is preferable that the compound shown by the general formula (1-1) be a compound shown by the following general formula (1-2),

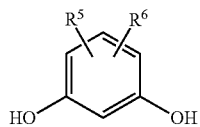

(1-2)

wherein each of $R^5$ and $R^6$ independently represents any of a hydrogen atom, a halogen atom, a hydroxyl group, an isocyanato group, a glycidyloxy group, a carboxyl group, an amino group, an alkoxyl group having 1 to 30 carbon atoms, an alkoxycarbonyl group having 1 to 30 carbon atoms, and an alkanoyloxy group having 1 to 30 carbon atoms, or an optionally substituted, saturated or unsaturated, organic group having 1 to 30 carbon atoms. In addition, two substituents shown by $R^5$ and $R^6$ within a molecule may be bonded to form a cyclic substituent group.

In the present invention, it is especially preferable if a polymer like this is contained therein, because not only the foregoing objects can be accomplished but also sufficient solvent resistance can be expressed especially even with low temperature PAB of 200° C. or lower.

In addition, the resist underlayer film composition may further contain any one or more of a crosslinking agent, an acid generator, and an organic solvent.

When the resist underlayer film composition contains further, as mentioned above, any one or more of an organic solvent, a crosslinking agent, and an acid generator, a coating property of the resist underlayer film composition can be improved further and a crosslinking reaction in the resist underlayer film can be facilitated by heat treatment (PAB) and so on after application thereof onto a body to be processed. The resist underlayer film thus formed becomes dense so that high solvent resistance can be expressed. In other words, when a film is laminated on the underlayer film, film thickness of the underlayer film is not reduced, nor does occur intermixing between the films.

In addition, the present invention provides a method for producing a polymer for a resist underlayer film composition, wherein the polymer is obtained by condensing one or more kinds of a compound shown by the following general formula (1-1) with one or more kinds of a compound shown by the following general formula (2-3) and an equivalent body thereof to obtain a condensed body, which is then condensed with one or more kinds of a compound shown by the following general formula (2-1), a compound shown by the following general formula (2-2), and an equivalent body thereof,

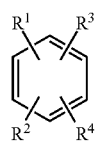

(1-1)

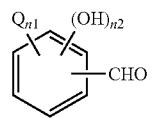

(2-1)

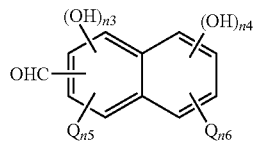

(2-2)

Y—CHO  (2-3)

wherein each of $R^1$ to $R^4$ independently represents any of a hydrogen atom, a halogen atom, a hydroxyl group, an isocyanato group, a glycidyloxy group, a carboxyl group, an amino group, an alkoxyl group having 1 to 30 carbon atoms, an alkoxycarbonyl group having 1 to 30 carbon atoms, and an alkanoyloxy group having 1 to 30 carbon atoms, or an optionally substituted, saturated or unsaturated, organic group having 1 to 30 carbon atoms. In addition, two substituents arbitrarily selected from each of $R^1$ to $R^4$ within a molecule may be bonded to form a cyclic substituent group. In the general formulae (2-1) and (2-2), Q represents an optionally substituted organic group having 1 to 30 carbon atoms; and in addition, two Groups represented by Q arbitrarily selected within a molecule may be bonded to form a cyclic substituent group, n1 to n6 represent numbers of each substituent groups, while each of them represents an integer of 0 to 2. In the general formula (2-2), these numbers satisfy the relationships of $0 \le n3+n5 \le 3$, $0 \le n4+n6 \le 4$, and $0 \le n3+n4 \le 4$. In the general formula (2-3), Y represents a hydrogen atom or an optionally substituted monovalent organic group having 1 to 30 carbon atoms, wherein (2-3) is different from (2-1) and (2-2).

According to the producing method like this, a polymer which is a condensed body having properties capable of accomplishing the afore-mentioned objects can be produced.

Further, it is preferable that the compound shown by the general formula (1-1) be a compound shown by the following general formula (1-2),

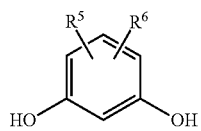

(1-2)

wherein each of $R^5$ and $R^6$ independently represents any of a hydrogen atom, a halogen atom, a hydroxyl group, an isocyanato group, a glycidyloxy group, a carboxyl group, an amino group, an alkoxyl group having 1 to 30 carbon atoms, an alkoxycarbonyl group having 1 to 30 carbon atoms, and an alkanoyloxy group having 1 to 30 carbon atoms, or an optionally substituted, saturated or unsaturated, organic group having 1 to 30 carbon atoms. In addition, two substituents shown by $R^5$ and $R^6$ within a molecule may be bonded to form a cyclic substituent group.

When the compound shown by the general formula (1-2) as mentioned above is used, the foregoing objects can be accomplished, whereby a polymer which can express sufficient solvent resistance especially even with low temperature PAB of 200° C. or lower can be obtained.

In addition, the present invention provides a patterning process, the patterning process to form a pattern on a body to be processed, wherein, at least, a resist underlayer film is formed on a body to be processed by using the afore-mentioned resist underlayer film composition, a resist middle layer film is formed on the resist underlayer film by using a silicon-containing resist middle layer film composition, a resist upper layer film is formed on the resist middle layer film by using a resist upper layer film composition which is a photoresist composition, a circuit pattern is formed on the resist upper layer film, the resist middle layer film is etched by using the resist upper layer film formed with the pattern as a mask, the resist underlayer film is etched by using the resist middle layer film formed with the pattern as a mask, and further, the body to be processed is etched by using the resist underlayer film formed with the pattern as a mask, whereby a pattern is formed on the body to be processed.

If patterning is done by a lithography using the resist underlayer film composition of the present invention as mentioned above, a pattern of a high precision can be formed on a substrate.

Further, the present invention provides a patterning process, the patterning process to form a pattern on a body to be processed, wherein, at least, a resist underlayer film is formed on a body to be processed by using the afore-mentioned resist underlayer film composition, a resist middle layer film is formed on the resist underlayer film by using a silicon-containing resist middle layer film composition, an organic antireflective film (BARC) is formed on the resist middle layer film, a resist upper layer film is formed on the BARC by using a resist upper layer film composition which is a photoresist composition, thereby forming a four-layered resist film, a circuit pattern is formed on the resist upper layer film, the BARC and the resist middle layer film are etched by using the resist upper layer film formed with the pattern as a mask, the resist underlayer film is etched by using the resist middle layer film formed with the pattern as a mask, and further, the body to be processed is etched by using the resist underlayer film formed with the pattern as a mask, whereby a pattern is formed on the body to be processed.

As mentioned above, according to the patterning process of the present invention, the BARC can also be formed between the resist middle layer film and the resist upper layer film.

Further, the present invention provides a patterning process, the patterning process to form a pattern on a body to be processed, wherein, at least, a resist underlayer film is formed on a body to be processed by using the afore-mentioned resist underlayer film composition, an inorganic hard mask middle layer film, selected from any of a silicon oxide film, a silicon nitride film, a silicon oxide nitride film, and an amorphous silicon film, is formed on the resist underlayer film, a resist upper layer film is formed on the inorganic hard mask middle layer film by using a resist upper layer film composition which is a photoresist composition, a circuit pattern is formed on the resist upper layer film, the inorganic hard mask middle layer film is etched by using the resist upper layer film formed with the pattern as a mask, the resist underlayer film is etched by using the inorganic hard mask middle layer film formed with the pattern as a mask, and further, the body to be processed is etched by using the resist underlayer film formed with the pattern as a mask, whereby a pattern is formed on the body to be processed.

As mentioned above, by using the resist underlayer film composition of the present invention, a pattern with a high precision can be formed on a substrate even if an inorganic hard mask middle layer film is used.

Further, the present invention provides a patterning process, the patterning process to form a pattern on a body to be processed, wherein, at least, a resist underlayer film is formed on a body to be processed by using the afore-mentioned resist underlayer film composition, an inorganic hard mask middle layer film, selected from any of a silicon oxide film, a silicon nitride film, a silicon oxide nitride film, and an amorphous silicon film, is formed on the resist underlayer film, an organic antireflective film (BARC) is formed on the inorganic hard mask middle layer film, a resist upper layer film is formed on the BARC by using a resist upper layer film composition which is a photoresist composition, thereby forming a four-layered resist film, a circuit pattern is formed on the resist upper layer film, the BARC and the inorganic hard mask middle layer film are etched by using the resist upper layer film formed with the pattern as a mask, the resist underlayer film is etched by using the inorganic hard mask middle layer film formed with the pattern as a mask, and further, the body to be processed is etched by using the resist underlayer film formed with the pattern as a mask, whereby a pattern is formed on the body to be processed.

If BARC is formed on the hard mask middle layer film as mentioned above, owing to two antireflective films, reflection can be suppressed even in an immersion photo-exposure with a high NA beyond 1.0. In addition, in so doing, a footing profile of a photoresist pattern on the hard mask middle layer film can be reduced.

Further, the foregoing inorganic hard mask middle layer film may be formed by a CVD method or an ALD method.

If the inorganic hard mask middle layer film is formed by a CVD method or an ALD method as mentioned above, an etching resistance can be made further high.

In addition, after the resist underlayer film is formed, this resist underlayer film can be subjected to heat treatment at 250° C. or lower.

In the resist underlayer film composition of the present invention, a crosslinking reaction takes place rapidly by heat treatment (PAB) during the time of film formation thereby forming a dense underlayer film even at comparatively low PAB 250° C. or lower so that high solvent resistance can be expressed. In other words, when a film is laminated on the underlayer film, chance of reducing film thickness of the underlayer film or intermixing between the films is low.

In addition, it is preferable that the patterning process of the resist upper layer film be done by any of a photolithography method with a wavelength range of 10 nm or longer to 300 nm or shorter, a direct drawing method by an electron beam, and a nanoimprinting method, or by a combination of them.

As mentioned above, in the present invention, patterning may be done on the resist upper layer film by any of a photolithography method with a wavelength range of 10 nm or longer to 300 nm or shorter, a direct drawing method by an electron beam, and a nanoimprinting method. Alternatively, patterning may be done by a combination of them.

Further, a development method in the foregoing patterning process may be an alkaline development or a development by an organic solvent.

In so doing, any of an alkaline development and a development by an organic solvent can be used in the present invention.

In addition, the body to be processed that is formed on a semiconductor substrate formed with any of a metal film, a metal carbide film, a metal oxide film, a metal nitride film, and a metal oxynitride film may be used.

In this case, it is preferable that the metal thereof be any of silicon, titanium, tungsten, hafnium, zirconium, chromium, germanium, copper, aluminum, and iron, or an alloy of these metals.

Consequently, according to the patterning process of the present invention, a pattern can be formed by processing of the body to be processed as mentioned above.

As explained above, the resist underlayer film which is formed by using the resist underlayer film composition of the present invention functions as an excellent antireflective film especially to an exposure light of a short wavelength that is, the resist underlayer film is highly transparent, and has desirable n-value and k-value, excellent filling-up properties, and an excellent pattern-bend resistance during the time of substrate processing. In addition, it expresses high solvent resistance even with low PAB 250° C. or lower during the time of film formation. Accordingly, when patterning is done by using the resist underlayer film composition of the present invention, a pattern of the upper layer photoresist can be transferred to the body to be processed thereby forming the pattern with excellent precision.

DESCRIPTION OF THE PREFERRED EMBODIMENTS

Figure 1:
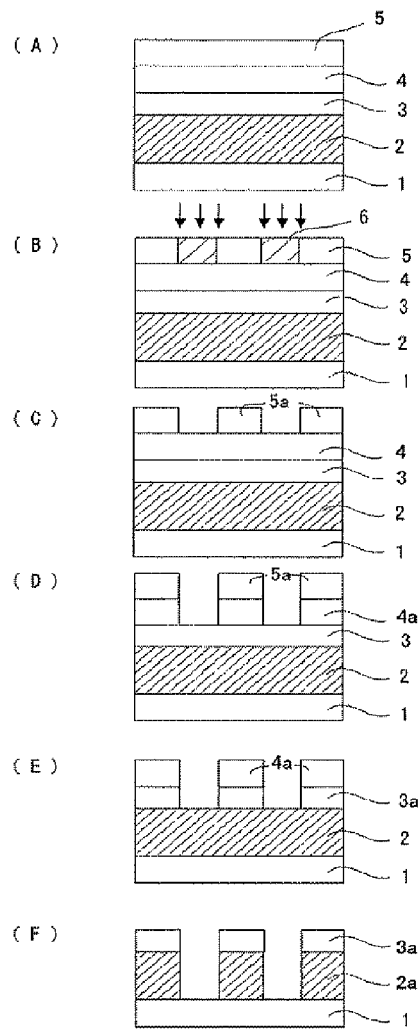
FIG. 1 is an explanatory drawing of the patterning process of the present invention (three-layer resist process).
Figure 2:
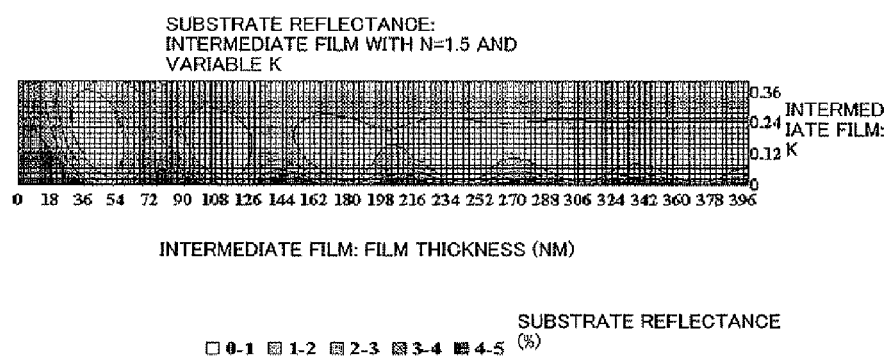
FIG. 2 is a graph showing relationship of the substrate reflectance with the k-value and film thickness of the middle layer film being changed from 0 to 0.4 and from 0 to 400 nm, respectively, and the n-value thereof being 1.5, while the refractive index n-value, the k-value, and film thickness of the underlayer film of the three-layer process are fixed at 1.5, 0.6, and 500 nm, respectively.
Figure 3:
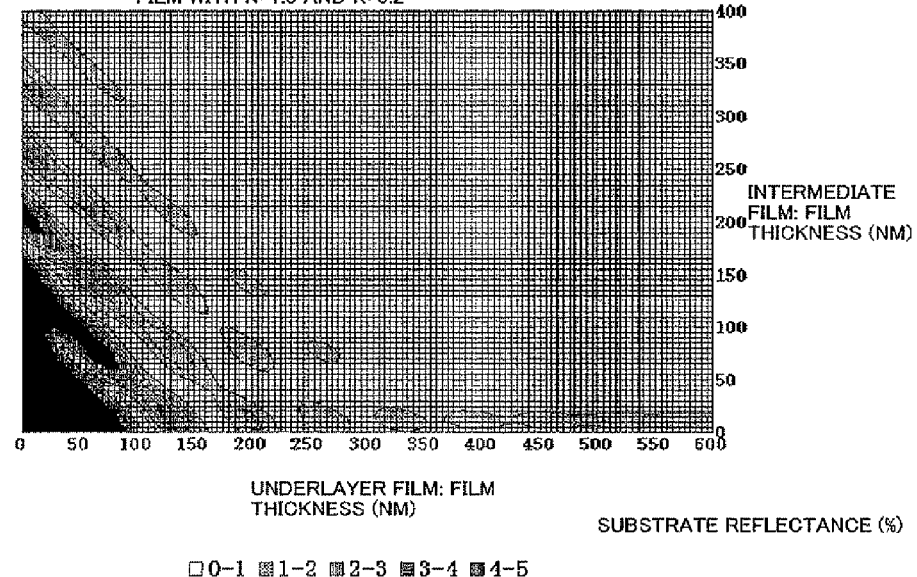
FIG. 3 is a graph showing relationship of the substrate reflectance with film thicknesses of the underlayer film and the middle layer film being changed while the refractive index n-value and the k-value of the underlayer film of the three-layer process are fixed at 1.5 and 0.2, respectively, and the n-value and the k-value of the middle layer film are fixed at 1.5 and 0.1, respectively.
Figure 4:
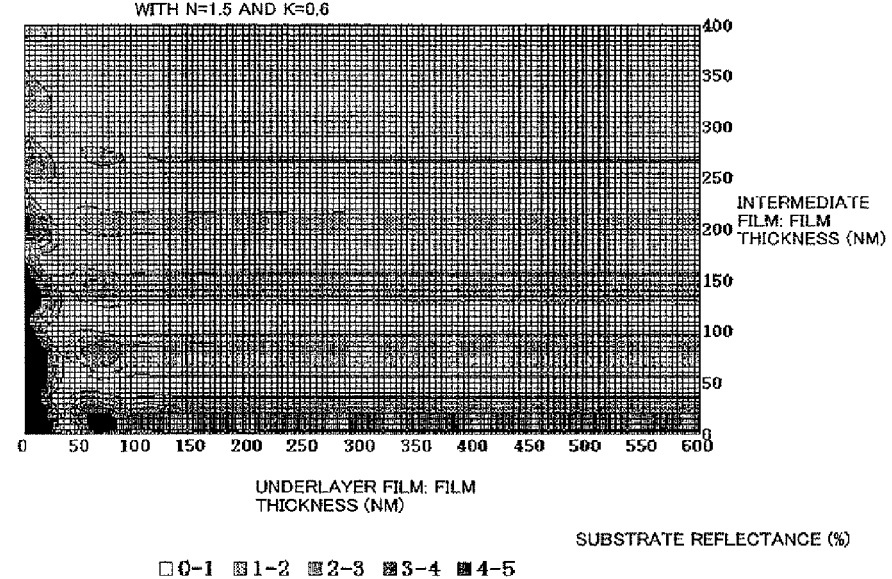
FIG. 4 is a graph showing relationship of the substrate reflectance with film thicknesses of the underlayer film and the middle layer film being changed while the refractive index n-value and the k-value of the underlayer film of the three-layer process are fixed at 1.5 and 0.6, respectively, and the n-value and the k-value of the middle layer film are fixed at 1.5 and 0.1, respectively.

Hereinafter, the present invention will be explained in more detail.

As mentioned above, as LSI advances toward higher integration and higher processing speed, what have been wanted are: an underlayer film composition having n-value, k-value, and filling-up properties suitable as an antireflective film with an excellent pattern-bend resistance while not wiggling during etching; and a patterning process thereof. In addition, in the case that a body to be processed has a thermally vulnerable structure, low temperature (for example, 250° C. or lower) during heat treatment (FAB temperature) of the underlayer film has been wanted.

In view of the above situation, inventors of the present invention carried out an extensive investigation firstly to obtain an underlayer film for a multilayer resist process which has a high pattern-bend resistance without causing line fall or wiggling after etching especially in a high aspect line that is thinner than 60 nm.

As a result, it was found that an underlayer film obtained from a composition which contains a condensed body obtained from any one of a benzene derivative and a naphthalene derivative or both and any one of a benzaldehyde derivative and a naphthaldehyde derivative or both such as those shown by the general formulae (2-1) and (2-2) has desirable n-value and k-value with high film strength (hardness) as measured with a nanoindentation method while not causing line fall or wiggling after etching. Especially a condensed body of a benzene derivative having high electron density, such as those compounds shown by the general formulae (1-1) and (1-2), is expected to express high film strength.

However, it was also found that a condensed body like this is extremely insoluble in a solvent or contains an insoluble component so that solution of an underlayer film composition could not be prepared therefrom. This is because a calixarene compound (cyclic polyphenol compound) is formed by condensation of the compounds in the foregoing combination. It is known that a calixarene having a similar structure to the above-mentioned condensed body has high crystallinity and low solubility in a solvent (Japanese Patent Laid-Open Publication No. 2004-18421 and International Patent Laid-Open Publication No. 2009/060869).

Accordingly, inventors of the present invention carried out an extensive investigation further; and as a result, it was found that, when a polymer—obtained by a method wherein firstly compounds shown by the general formulae (1-1) and (1-2) are condensed with a compound shown by the general formula (2-3) or an equivalent body thereof to obtain a condensed body, which is further condensed with compounds shown by the general formulae (2-1) and (2-2) or an equivalent body thereof—is contained, a resist underlayer film composition having the intended above-mentioned characteristics can be obtained; and thus, the present invention could be accomplished.

Hereinafter, embodiments of the present invention will be explained; but the present invention is not limited to them.

The resist underlayer film composition of the present invention is characterized by that the composition contains a polymer obtained by condensation of a condensed body, the body being obtained by condensation of one or more kinds of a compound shown by the following general formula (1-1) with one or more kinds of a compound shown by the following general formula (2-3) and an equivalent body thereof, with one or more kinds of a compound shown by the following general formula (2-1), a compound shown by the following general formula (2-2), and an equivalent body thereof,

(1-1)

(2-1)

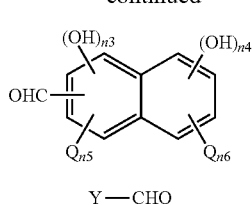

wherein each of $R^1$ to $R^4$ independently represents any of a hydrogen atom, a halogen atom, a hydroxyl group, an isocyanato group, a glycidyloxy group, a carboxyl group, an amino group, an alkoxyl group having 1 to 30 carbon atoms, an alkoxycarbonyl group having 1 to 30 carbon atoms, and an alkanoyloxy group having 1 to 30 carbon atoms, or an optionally substituted, saturated or unsaturated, organic group having 1 to 30 carbon atoms. In addition, two substituents arbitrarily selected from each of $R^1$ to $R^4$ within a molecule may be bonded to form a cyclic substituent group. In the general formulae (2-1) and (2-2), Q represents an optionally substituted organic group having 1 to 30 carbon atoms; and in addition, two Groups represented by Q arbitrarily selected within a molecule may be bonded to form a cyclic substituent group, n1 to n6 represent numbers of each substituent groups, while each of them represents an integer of 0 to 2. In the general formula (2-2), these numbers satisfy the relationships of $0 \leq n3+n5 \leq 3$, $0 \leq n4+n6 \leq 4$, and $0 \leq n3+n4 \leq 4$. In the general formula (2-3), Y represents a hydrogen atom or an optionally substituted monovalent organic group having 1 to 30 carbon atoms, wherein (2-3) is different from (2-1) and (2-2).

It is more preferable that the resist underlayer film composition of the present invention contain a polymer obtained by condensation of a condensed body, the body being obtained by condensation of one or more kinds of a compound shown by the following general formula (1-2) with one or more kinds of a compound shown by the following general formula (2-3) and an equivalent body thereof, with one or more kinds of a compound shown by the following general formula (2-1), a compound shown by the following general formula (2-2), and an equivalent body thereof,

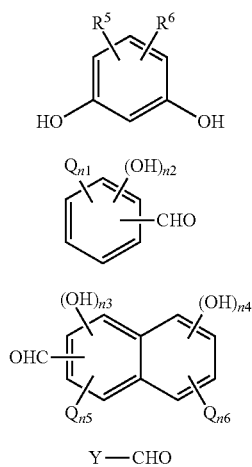

wherein each of $R^5$ and $R^6$ independently represents any of a hydrogen atom, a halogen atom, a hydroxyl group, an isocyanato group, a glycidyloxy group, a carboxyl group, an amino group, an alkoxyl group having 1 to 30 carbon atoms, an alkoxycarbonyl group having 1 to 30 carbon atoms, and an alkanoyloxy group having 1 to 30 carbon atoms, or an optionally substituted, saturated or unsaturated, organic group having 1 to 30 carbon atoms. In addition, two substituents shown by $R^5$ and $R^6$ within a molecule may be bonded to form a cyclic substituent group.

Here, the organic group in the present invention means that the group contains a carbon atom and further a hydrogen atom, and optionally a nitrogen atom, an oxygen atom, a sulfur atom, and so on.

A polymer obtained by condensation under the condition of coexistence of all of the compounds—compounds shown by the general formulae (1-1) and (1-2) (hereinafter, sometimes referred to as "benzene derivatives (1-1) and (1-2)"), any one of a compound shown by the general formula (2-3) and an equivalent body thereof or both (hereinafter, sometimes referred to as "aldehyde compound (2-3)"), and any one of compounds shown by the general formulae (2-1) and (2-2) and an equivalent body thereof or both (hereinafter, sometimes referred to as "aldehyde compounds (2-1) and (2-2)")—is not suitable as an underlayer film material because it contains a small amount of a component hardly soluble in a solvent. This hardly soluble component is considered to be a condensed body of the compound shown by the general formula (1-1) with the compounds shown by the general formulae (2-1) and (2-2) or the equivalent body thereof.

On the other hand, a condensed body of benzene derivatives (1-1) and (1-2) with an aldehyde compound (2-3) has sufficient solubility in a solvent; but it is difficult to obtain a high molecular weight thereof because gelation occurs when an attempt is made to increase its molecular weight. If a condensed body not yet having a sufficiently high molecular weight is used as it is, solvent resistance of the underlayer film is insufficient so that film thickness of the underlayer film is reduced and intermixing occurs between the films.

However, when the condensed body of this benzene derivatives (1-1) and (1-2) with an aldehyde compound (2-3) is further condensed with aldehyde compounds (2-1) and (2-2), a polymer having a sufficiently high molecular weight without containing a component hardly soluble in a solvent can be obtained; and when this polymer is used as the underlayer film material, the afore-mentioned various properties of the underlayer film can be satisfied.

That is, a resist underlayer film which is formed by using a resist underlayer film composition containing the polymer like this functions as an excellent antireflective film to an exposure light of a short wavelength. In other words, the resist underlayer film is highly transparent and has desirable n-value and k-value. In addition, it has not only an excellent pattern-bend resistance during the time of substrate processing but also a sufficient solvent resistance even if temperature during formation of the underlayer film (PAB temperature) is comparatively low (for example, 250° C. or lower).

Illustrative example of the benzene derivative shown by the general formulae (1-1) and (1-2) includes toluene, o-xylene, m-xylene, p-xylene, cumene, indane, indene, mesitylene, biphenyl, fluorene, phenol, anisole, o-cresol, m-cresol, p-cresol, 2,3-dimethyl phenol, 2,5-dimethyl phenol, 3,4-dimethyl phenol, 3,5-dimethyl phenol, 2,4-dimethyl phenol, 2,6-dimethyl phenol, 2,3,5-trimethyl phenol, 3,4,5-trimethyl phenol, 2-t-butyl phenol, 3-t-butyl phenol, 4-t-butyl phenol, resorcinol, 2-methyl resorcinol, 4-methyl resorcinol, 5-methyl resorcinol, catechol, 4-t-butyl catechol, hydroquinone, 2-methoxy phenol, 3-methoxy phenol, 2-propyl phenol, 3-propyl phenol, 4-propyl phenol, 2-isopropyl phenol, 3-isopropyl phenol, 4-isopropyl phenol, 2-methoxy-5-methyl phenol, 2-t-butyl-5-methyl phenol, 4-phenyl phenol, trityl phenol, 1,2,3-benzenetriol, 1,2,4-benzenetriol, 1,3,5-benzenetriol, thymol, phenyl glycidyl ether, 4-fluorophenol, 3,4-difluorophenol, 4-trifluoromethyl phenol, 4-chlorophenol, 9,9-bis(4-hydroxyphenyl)fluorene, styrene, 4-t-butoxy styrene, 4-acetoxy styrene, 4-methoxy styrene, divinyl benzene, and benzylalcohol.

Compounds shown by the general formulae (1-1) and (1-2) may be used singly or in a combination of two or more of them so that n-value, k-value, and etching resistance may be controlled.

Illustrative example of the aldehyde compound shown by the general formula (2-1) may be shown by the following formulae.

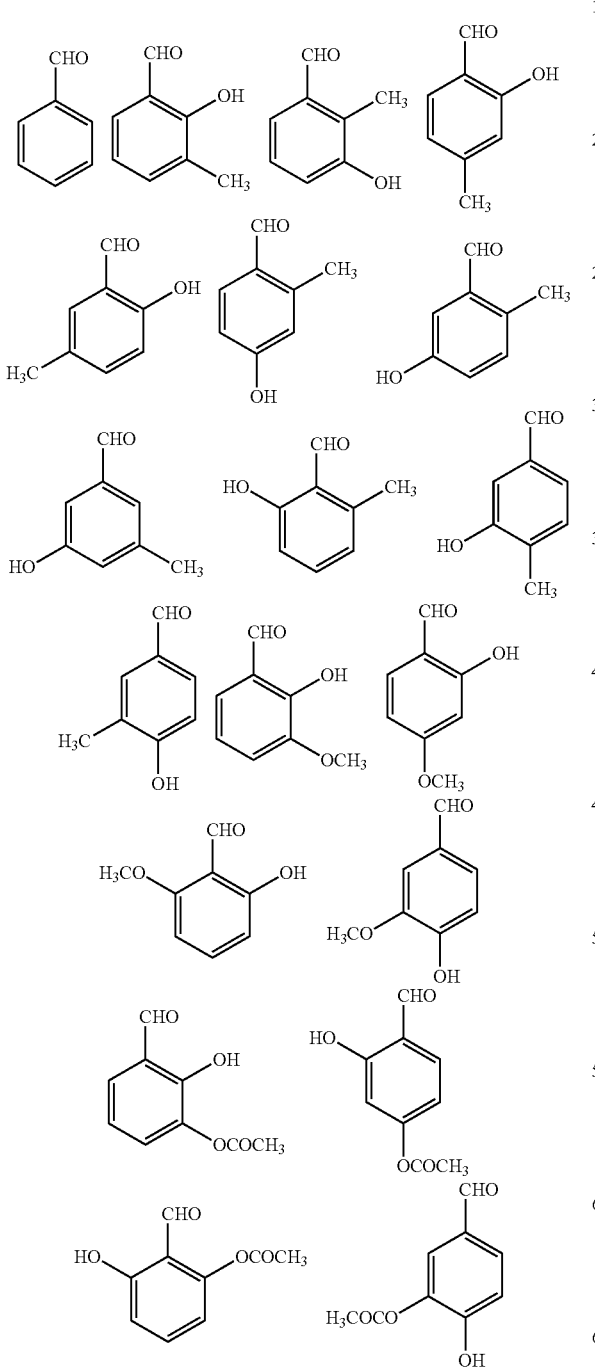

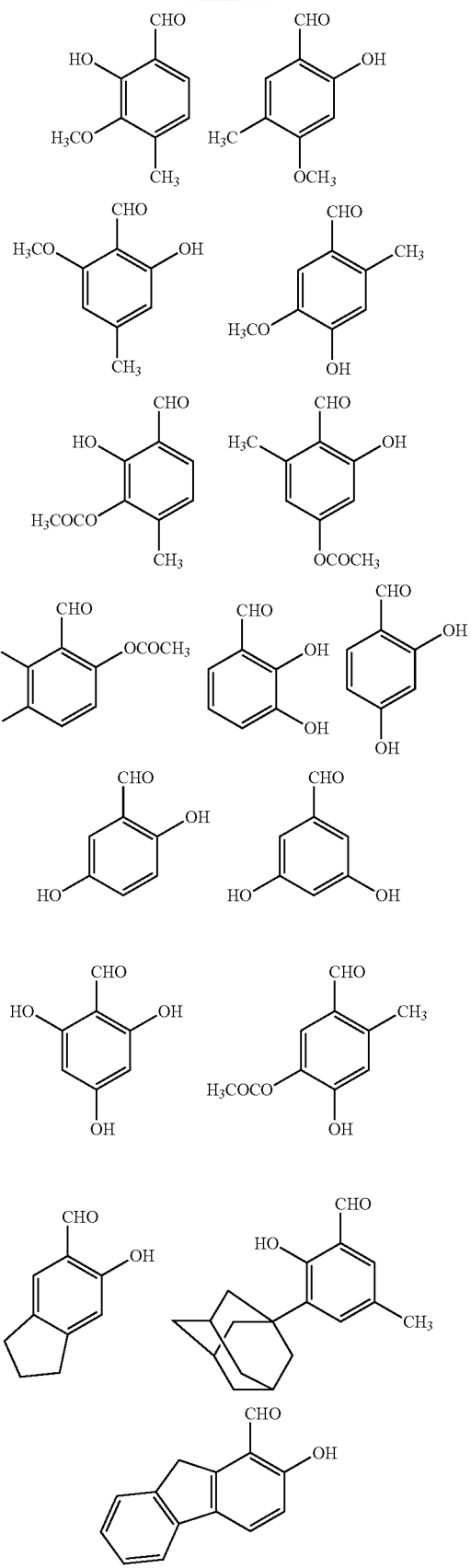

-continued
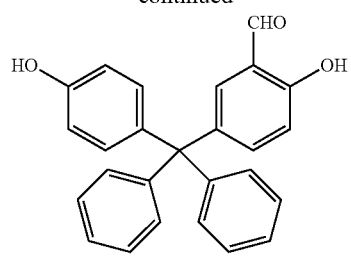
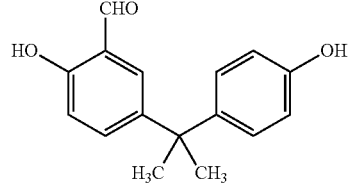
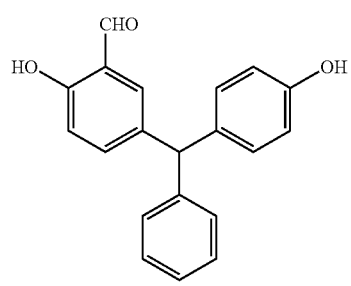
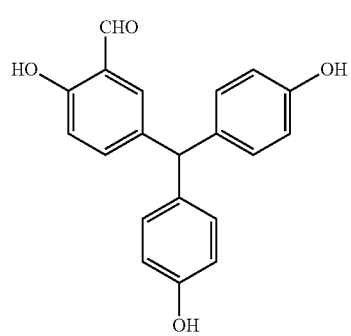
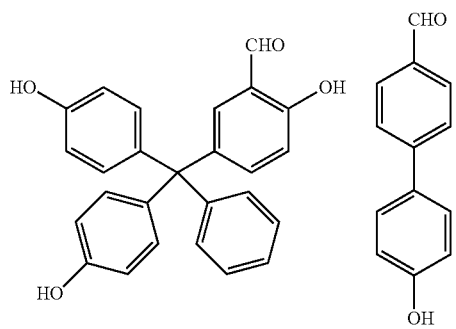
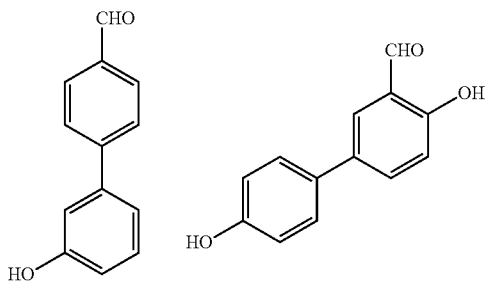
-continued
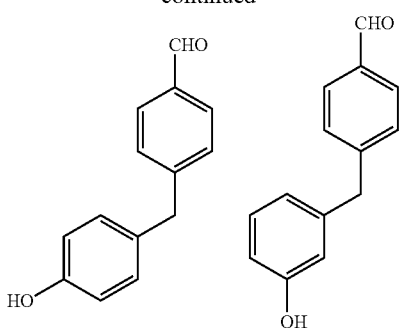
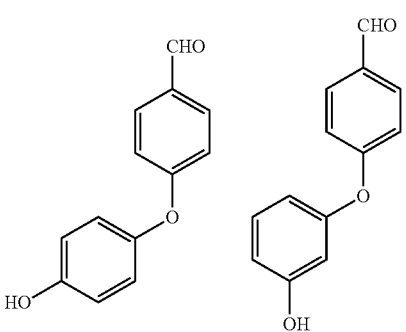
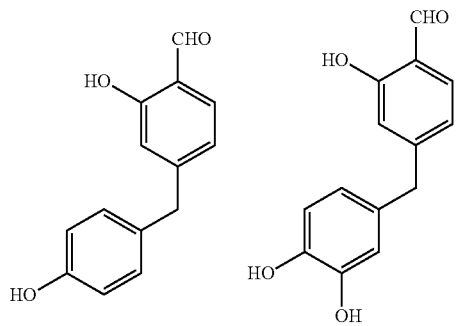
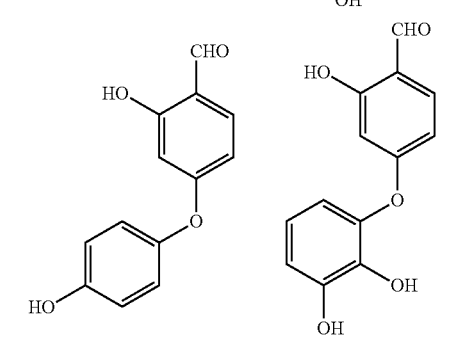
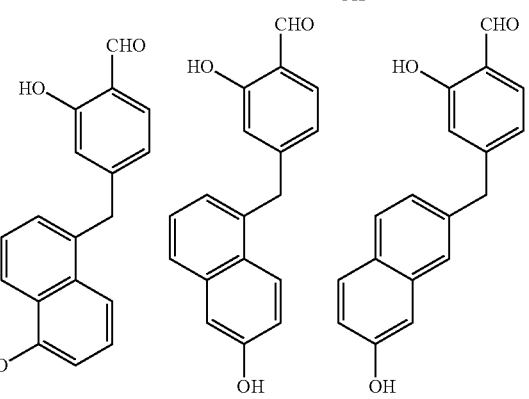

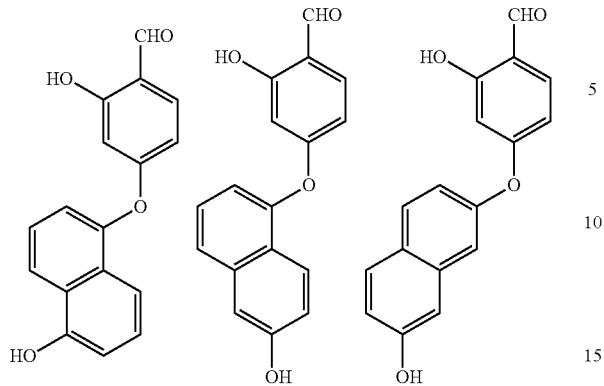
Illustrative example of the aldehyde compound shown by the general formula (2-2) may be shown by the following formulae.
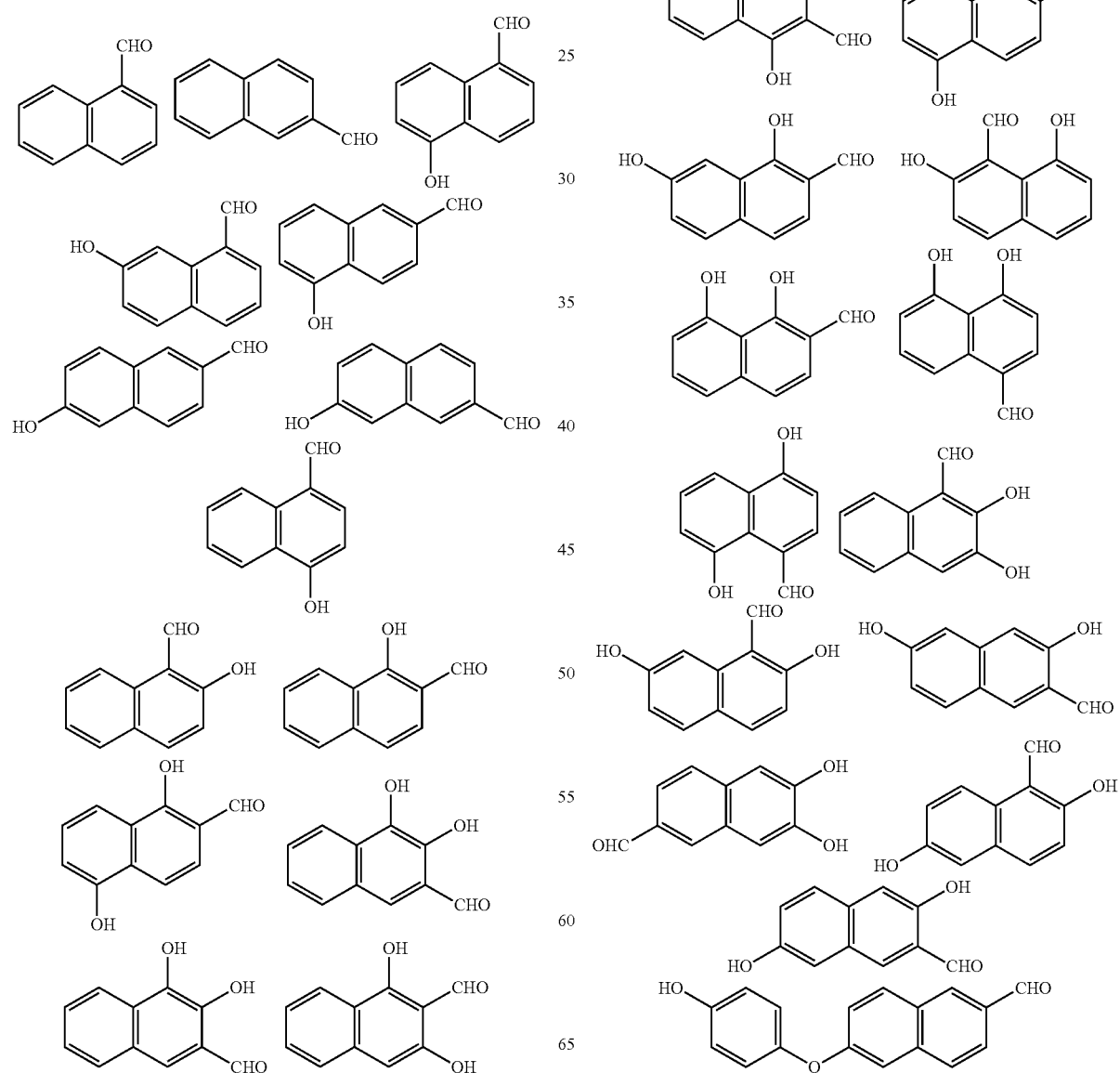
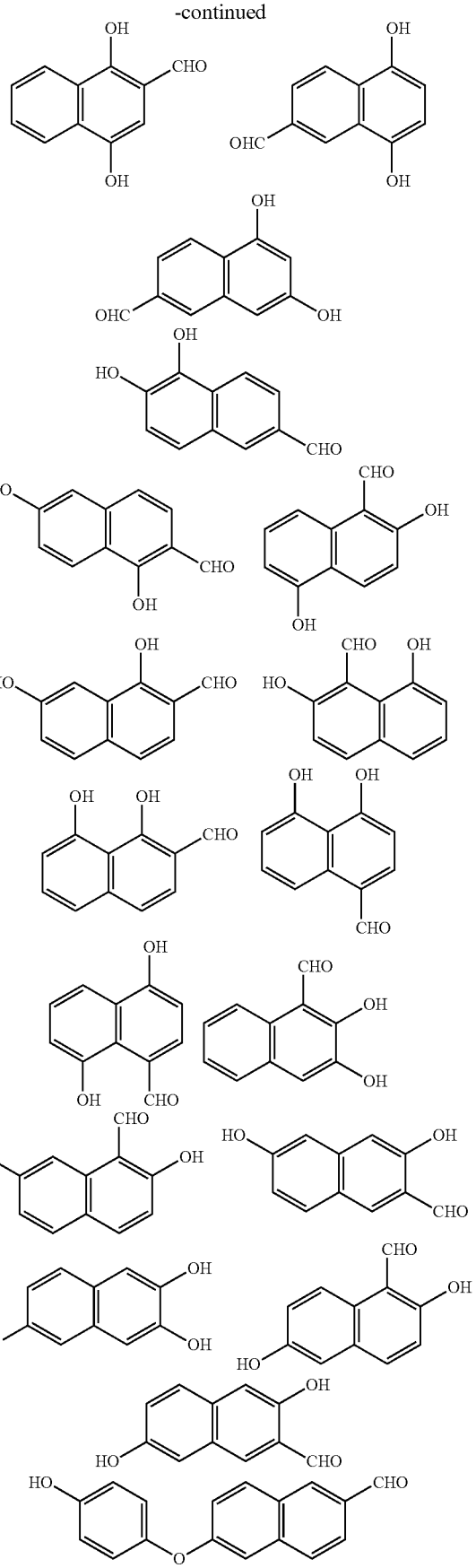

-continued

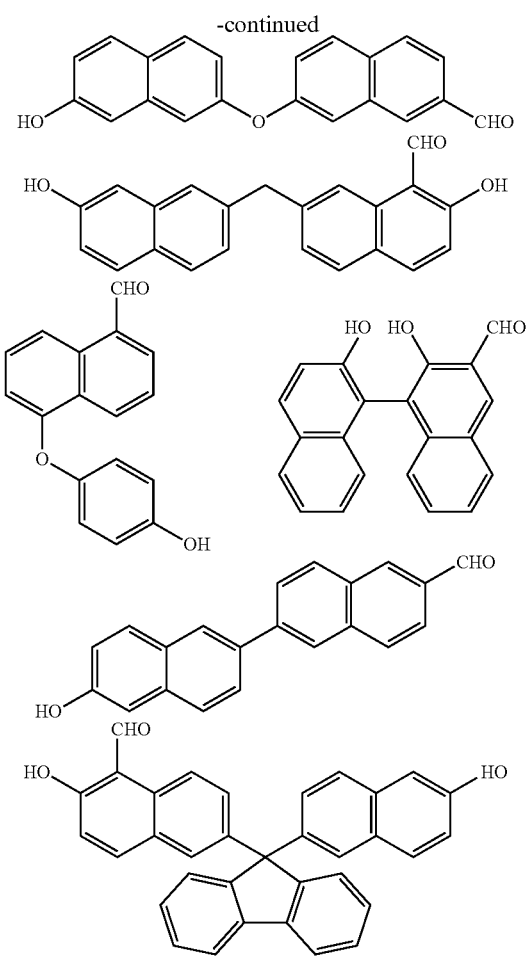

In addition, equivalent bodies of the aldehyde compounds shown here may be used.

Illustrative example of the equivalent body of the compound shown by the general formula (2-1) includes the following general formulae,

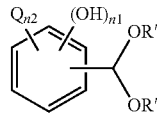

(2-1-A)

wherein Q, n1, and n2 represent the same meanings as before, and each R' represents the same or different monovalent hydrocarbon group having 1 to 10 carbon atoms,

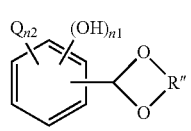

(2-1-B)

wherein Q, n1, and n2 represent the same meanings as before, and R" represents a divalent hydrocarbon group having 1 to 10 carbon atoms.

Illustrative examples of the equivalent body of the type of (2-1-A) are shown below, and the same is applied to other aldehyde compounds.

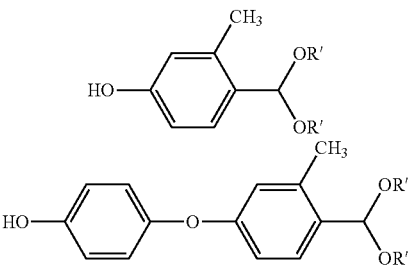

Illustrative examples of the equivalent body of the type of (2-1-B) are shown below, and the same is applied to other aldehyde compounds.

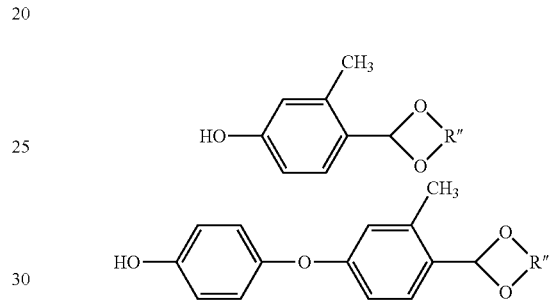

Further, illustrative example of the equivalent body of the compound shown by the general formula (2-2) includes the following general formulae,

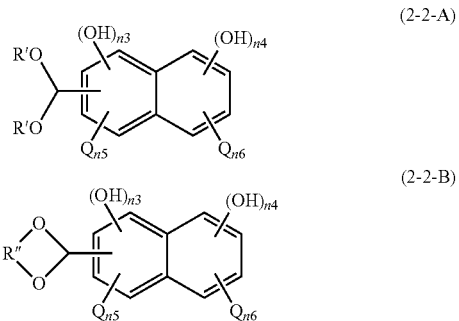

wherein Q, n3 to n6, R', and R" represent the same meanings as before.

Illustrative example of the aldehyde compound shown by the general formula (2-3) includes formaldehyde, trioxane, paraformaldehyde, acetaldehyde, propyl aldehyde, adamantane carboaldehyde, benzaldehyde, phenyl acetaldehyde, α-phenylpropyl aldehyde, β-phenylpropyl aldehyde, o-chloro benzaldehyde, m-chloro benzaldehyde, p-chloro benzaldehyde, o-nitro benzaldehyde, m-nitro benzaldehyde, p-nitro benzaldehyde, o-methyl benzaldehyde, m-methyl benzaldehyde, p-methyl benzaldehyde, p-ethyl benzaldehyde, p-n-butyl benzaldehyde, 1-naphthylaldehyde, 2-naphthylaldehyde, anthracene carboaldehyde, pyrene carboaldehyde, furfural, methylal, phthaldehyde, isophthaldehyde, terephthaldehyde, naphthalene dicarboaldehyde, anthracene dicarboaldehyde, pyrene dicarboaldehyde, cyclohexane dialdehyde, and norbornane dialdehyde.

In addition, similarly to the aldehyde compounds shown by the general formulae (2-1) and (2-2), aldehyde equivalent bodies thereof and the like can be used.

Illustrative example of the equivalent body of the compound shown by the general formula (2-3) includes any one of a compound shown by the following general formula (2-3-A) and a compound shown by the following general formula (2-3-B) or both,

(2-3-A)

wherein Y represents the same meaning as before, and each R' represents the same or different monovalent hydrocarbon group having 1 to 10 carbon atoms,

(2-3-B)

wherein Y represents the same meaning as before, and R" represents a divalent hydrocarbon group having 1 to 10 carbon atoms.

Illustrative example of the polymer which is obtained from these benzene derivatives and aldehyde compounds and contained in the resist underlayer film composition of the present invention includes a polymer shown by the following general formula (3),

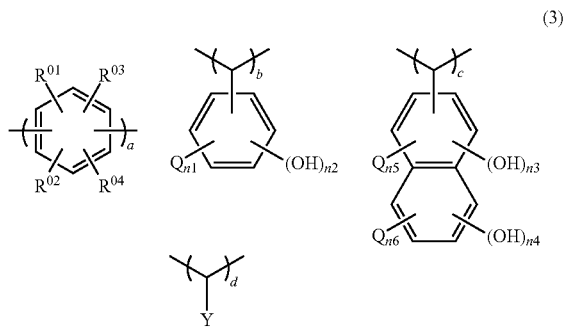
(3)

wherein Q, Y, and n1 to n6 represent the same meanings as before. Each of $R^{01}$ to $R^{04}$ independently represents any of a single bond, a hydrogen atom, a halogen atom, a hydroxyl group, an isocyanato group, a glycidyloxy group, a carboxyl group, an amino group, an alkoxyl group having 1 to 30 carbon atoms, an alkoxycarbonyl group having 1 to 30 carbon atoms, and an alkanoyloxy group having 1 to 30 carbon atoms, or an optionally substituted, saturated or unsaturated, organic group having 1 to 30 carbon atoms. In addition, two substituents arbitrarily selected from each of $R^{01}$ to $R^{04}$ in the unit thereof may be bonded to form a cyclic substituent group. a, b, c, and d represent respective ratios of each unit in totality of the repeating units, wherein they satisfy the relationships of $b+c+d \le a<1$ and $a+b+c+d=1$.

The ratio in totality of the repeating units is preferably $0.1<a<1$, or more preferably $0.3<a<0.95$.

A compound comprised of the foregoing units (such as the one shown by the general formula (3)) can be usually produced by a condensation reaction (for example, a condensation by dehydration) of corresponding compounds (monomers) charged all at once by using an acid or a base as a catalyst in a solvent or without solvent at room temperature or with cooling or heating as appropriate.

However, as mentioned before, when raw materials are charged all at once, small amount of a condensed body of benzene derivatives (1-1) and (1-2) with aldehyde compounds (2-1) and (2-2), a component hardly soluble in a solvent, is produced; and thus, this cannot be used in the resist underlayer film composition.

Accordingly, in the present invention, provided is a method for producing a polymer for a resist underlayer film composition, wherein the polymer is obtained by condensing a compound shown by the general formula (1-1), preferably one or more kinds of a compound shown by the general formula (1-2), with one or more kinds of a compound shown by the general formula (2-3) and an equivalent body thereof to obtain a condensed body, which is then condensed with one or more kinds of a compound shown by the general formula (2-1), a compound shown by the general formula (2-2), and an equivalent body thereof.

According to the production method of the present invention as mentioned above, the obtained polymer does not contain a condensed body only comprised of benzene derivatives (1-1) and (1-2) and aldehyde compounds (2-1) and (2-2), the condensed body being hardly soluble in a solvent. In addition, a polymer suitable for the resist underlayer film composition can be produced by a method wherein compounds shown by the general formulae (1-1) and (1-2) are condensed with a compound shown by the general formula (2-3) to obtain a condensed body, which is further condensed with compounds shown by the general formulae (2-1) and (2-2) or an equivalent body thereof whereby increasing molecular weight of the polymer.

In the method for producing the polymer for the resist underlayer film composition according to the present invention, firstly one or more kinds of a compound shown by the general formula (1-1) and one or more kinds of a compound shown by the general formula (2-3) and an equivalent body thereof are condensed to obtain a condensed body.

A condensed body of a benzene derivative with an aldehyde compound (2-3) can be obtained by a condensation reaction (for example, a condensation by dehydration) of corresponding compounds (monomers) by using an acid or a base as a catalyst in a solvent or without solvent at room temperature or with cooling or heating as appropriate.

Here, the ratio of the benzene derivatives (1-1) and (1-2) with the aldehyde compound (2-3) is preferably 0.3 to 2.0, or more preferably 0.4 to 1.5, relative to 1.0 mole of the benzene derivatives (1-1) and (1-2).

Illustrative example of the solvent to be used therein includes an alcohol such as methanol, ethanol, isopropyl alcohol, butanol, ethylene glycol, propylene glycol, diethylene glycol, glycerol, methyl cellosolve, ethyl cellosolve, butyl cellosolve, propylene glycol monomethyl ether, and propylene glycol monoethyl ether; an ether such as diethyl ether, dibutyl ether, diethylene glycol diethyl ether, diethylene glycol dimethyl ether, tetrahydrofurane, and 1,4-dioxane; a chlorinated solvent such as methylene chloride, chloroform, dichloroethane, and trichloroethylene; a hydrocarbon such as hexane, heptane, benzene, toluene, xylene, and cumene; a nitrile such as acetonitrile; a ketone such as acetone, ethyl methyl ketone, and isobutyl methyl ketone; an ester such as ethyl acetate, n-butyl acetate, and propylene glycol methyl ether acetate; a lactone such as γ-butyrolactone; and a non-protic polar solvent such as dimethyl sulfoxide, N,N-dimethyl formamide, and hexamethyl phosphoric triamide. These may be used singly or as a mixture of two or more of them. These solvents may be used in the range between 0 and 2000 parts by mass relative to 100 parts by mass of raw materials of the reaction.

Illustrative example of the acid catalyst to be used therein includes an inorganic acid such as hydrochloric acid, hydrobromic acid, sulfuric acid, nitric acid, phosphoric acid, and heteropolyacid; an organic acid such as oxalic acid, trifluoroacetic acid, methane sulfonic acid, benzene sulfonic acid, p-toluene sulfonic acid, and trifluoromethane sulfonic acid; a Lewis acid such as aluminum trichloride, aluminum ethoxide, aluminum isopropoxide, boron trifluoride, boron trichloride, boron tribromide, stannous tetrachloride, stannous tetrabromide, dibutyltin dichloride, dibutyltin dimethoxide, dibutyltin oxide, titanium tetrachloride, titanium tetrabromide, titanium (IV) methoxide, titanium (IV) ethoxide, titanium (IV) isopropoxide, and titanium (IV) oxide.

Illustrative example of the base catalyst to be used therein includes an inorganic base such as sodium hydroxide, potassium hydroxide, barium hydroxide, sodium carbonate, sodium hydrogen carbonate, potassium carbonate, lithium hydride, sodium hydride, potassium hydride, and calcium hydride; an alkyl metal such as methyl lithium, n-butyl lithium, methyl magnesium chloride, and ethyl magnesium bromide; an alkoxide such as sodium methoxide, sodium ethoxide, and potassium t-butoxide; and an organic base such as triethyl amine, diisoproyl ethyl amine, N,N-dimethylaniline, pyridine, and 4-dimethylamino pyridine.

Amount of these catalysts relative to raw materials is 0.001 to 100% by mass, or preferably 0.005 to 50% by mass. Temperature of the reaction is preferably between −50° C. and about boiling point of a solvent, or more preferably between room temperature and 150° C.

As to the method for carrying out the condensation reaction, there are a method in which monomers and a catalyst are charged all at once and a method in which a monomer solution is gradually added into a reaction vessel charged with a catalyst. Alternatively, a catalyst may be added to charged monomers.

After the condensation reaction, in order to remove a unreacted raw material, a catalyst, and so on that are present in the reaction system, a method in which temperature of the reaction vessel is raised to 130 to 230° C. with evacuation at about 1 to about 50 mmHg to remove volatile components, a method in which the condensed body is purified by adding an appropriate solvent and water, a method in which the condensed body is dissolved into a good solvent then reprecipitated into a poor solvent, and so on, can be used by selecting them in accordance with properties of a reaction product for work up.

Then, the condensed body thus obtained is condensed with one or more kinds of compounds shown by the general formulae (2-1) and (2-2) and an equivalent body thereof to obtain the polymer for the resist underlayer film composition.

Here, the condensed body of the benzene derivatives (1-1) and (1-2) with the aldehyde compound (2-3) is once isolated, after purification thereof as appropriate; and then, it may be condensed with the aldehyde compounds (2-1) and (2-2) (two-step preparation method). Alternatively, the aldehyde compound (2-1) and (2-2) may be added for condensation to the reaction solution obtained after condensation of the benzene derivatives (1-1) and (1-2) with the aldehyde compound (2-3) (one-pot preparation method).

The ratio of the benzene derivatives (1-1) and (1-2) with the aldehyde compounds (2-1) and (2-2) is preferably 0.1 to 2.0, or more preferably 0.2 to 1.5, relative to 1.0 mole of the benzene derivatives (1-1) and (1-2).

A condensed polymer of the condensed body of the benzene derivatives (1-1) and (1-2) and the aldehyde compound (2-3) with the aldehyde compounds (2-1) and (2-2) can be obtained by a condensation reaction (for example, a condensation by dehydration) of corresponding compounds (monomers) by using an acid or a base as a catalyst in a solvent or without solvent at room temperature or with cooling or heating as appropriate.

The solvent, the acid catalyst, and the base catalyst to be used therein, and amount of them may be the same as before.

As to the method for carrying out the condensation reaction, there are a method in which the foregoing condensed body, the aldehyde derivatives (2-1) and (2-2), and a catalyst are charged all at once and a method in which a mixture solution of the foregoing condensed body and the aldehyde derivatives (2-1) and (2-2) is gradually added into a reaction vessel charged with a catalyst. Alternatively, a catalyst may be added to the foregoing condensed body and the aldehyde derivatives (2-1) and (2-2), all of which are charged into a reaction vessel in advance.

After the condensation reaction, in order to remove a unreacted raw material, a catalyst, and so on that are present in the reaction system, a method in which temperature of the reaction vessel is raised to 130 to 230° C. with evacuation at about 1 to about 50 mmHg to remove volatile components, a method in which the polymer is purified by adding an appropriate solvent and water, a method in which the polymer is dissolved into a good solvent then reprecipitated into a poor solvent, and so on, can be used by selecting them in accordance with properties of a reaction product for work up.

Polystyrene-equivalent molecular weight of the polymer thus obtained is preferably 1,000 to 200,000, or in particular 1,500 to 100,000, as the weight-average molecular weight (Mw). Dispersity (Mw/Mn) is preferably 1.1 to 20. Meanwhile, by removing a monomer component, an oligomer component, or a low-molecular weight body of a molecular weight of less than 1,000, amount of volatile organic components evaporated from the film during the time of heat treatment (PAB) for film formation can be reduced, so that pollution around a baking cup or formation of defects on film surface caused by fall of the volatile components may be prevented from occurring.

As mentioned above, molecular weight of the condensed body of the benzene derivatives (1-1) and (1-2) with the aldehyde compound (2-3) is low, so that there is a possibility that large amount of organic components may be evaporated from the film during PAB. When this condensed body is further condensed with the aldehyde compounds (2-1) and (2-2) to increase the molecular weight thereof, amount of the volatile organic components can be reduced.

Into this polymer, a condensed aromatic or an alicyclic substituent may be introduced.

Illustrative example of the introducible substituent group can be shown below.

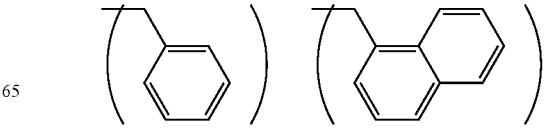

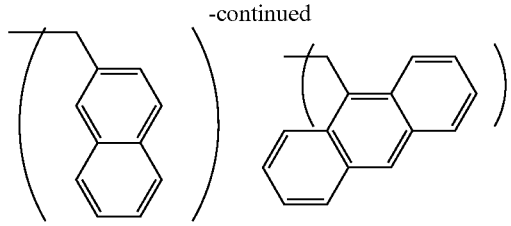
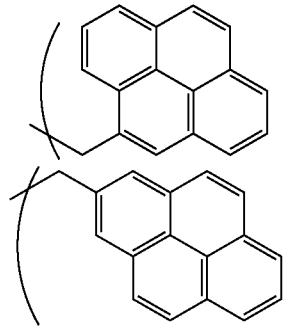
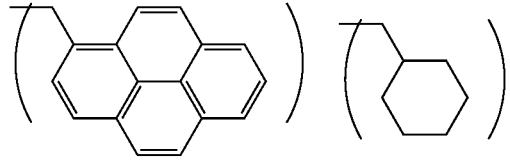
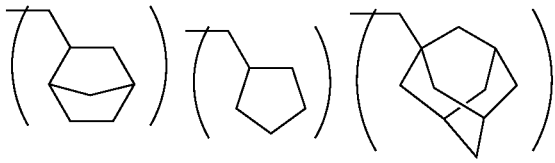
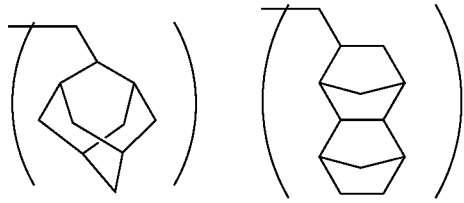
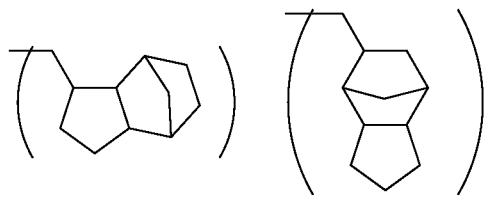
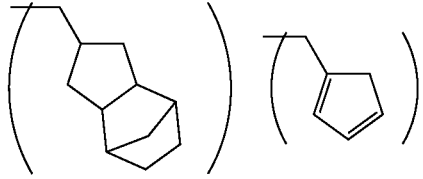
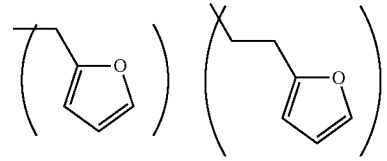
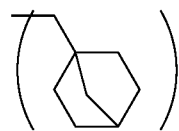
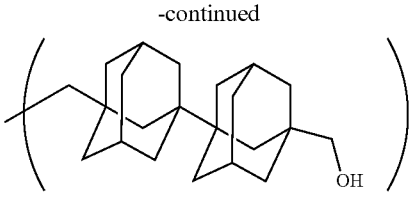
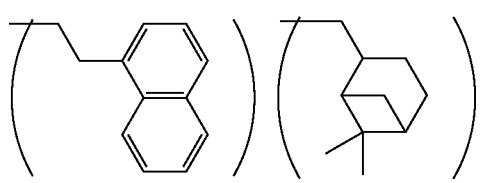
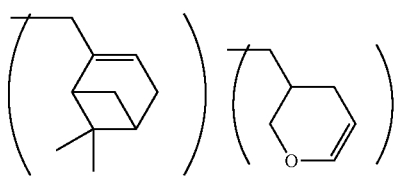
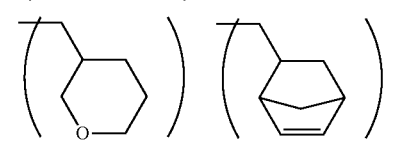
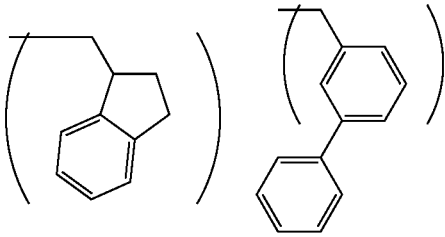
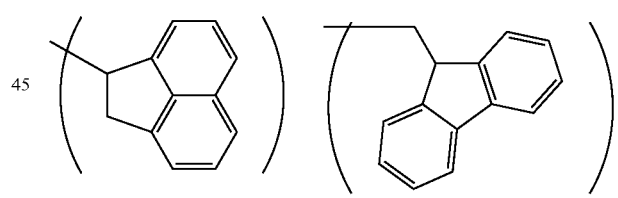
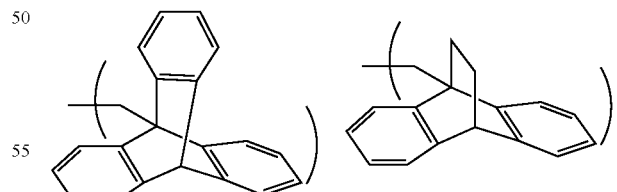
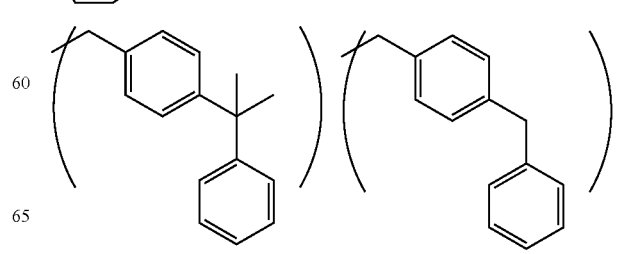

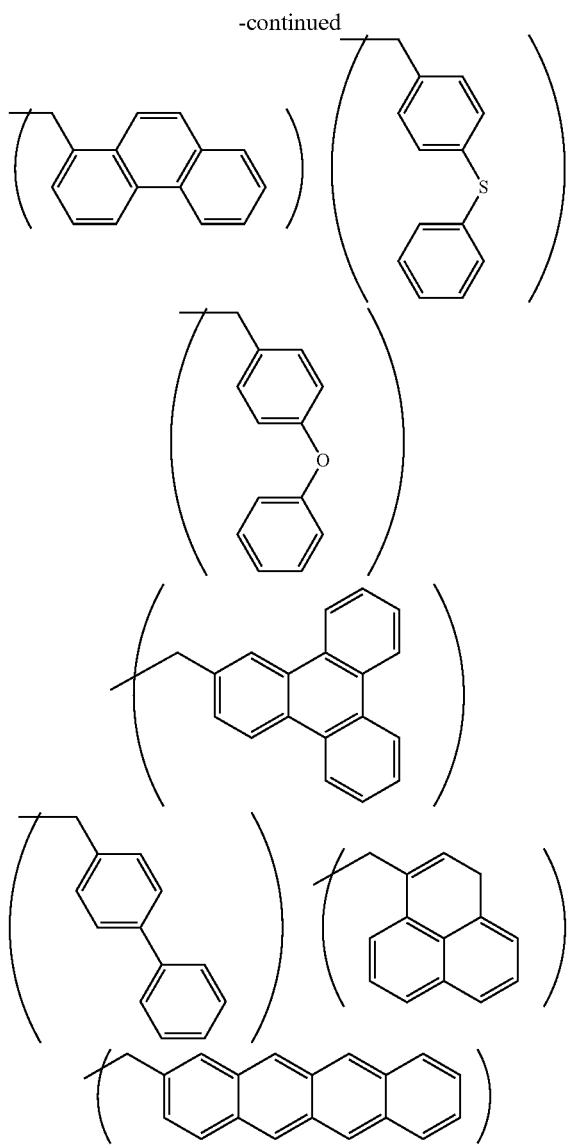

Among them, for a photo-exposure to the light of 248 nm, polycyclic aromatic groups, such as for example, an anthracenemethyl group and a pyrenemethyl group, are most preferably used. To increase transparency at 193 nm, a group having an alicyclic structure or a naphthalene structure is preferably used. On the other hand, a benzene ring has a window to increase transparency at 157 nm; and thus, absorbance thereof needs to be increased by shifting an absorption wavelength. A furane ring has an absorption at a shorter wavelength than a benzene ring so that the absorption at 157 nm is somewhat increased, though its effect is small. A naphthalene structure, an anthracene structure, and a pyrene structure increase the absorption due to shifting of the absorption wavelength toward a longer wavelength so that these aromatic rings have an effect to increase an etching resistance; and thus, they are preferably used.

These substituent groups may be introduced by a method in which an alcohol having bonding site of a hydroxyl group in the foregoing substituent group is reacted with a polymer in the presence of an acid catalyst in accordance with a reaction mechanism of an aromatic electrophilic substitution. In this case, the foregoing substituent group is introduced at the ortho-position or the para-position relative to a hydroxy group or an alkyl group in the aromatic ring. Illustrative example of the acid catalyst includes hydrochloric acid, nitric acid, sulfuric acid, formic acid, oxalic acid, acetic acid, methanesulfonic acid, n-butanesulfonic acid, camphorsulfonic acid, p-toluenesulfonic acid, and trifluoromethanesulfonic acid. Amount of these acid catalysts to be used is 0.001 to 20 parts by mass, relative to 100 parts by mass of the polymer before the reaction. Amount of the introduced substituent group is in the range of 0 to 0.8 mole relative to 1 mole of a monomer unit in the polymer.

Further, in the underlayer film composition of the present invention, the above-mentioned polymer may be blended with another polymer. Illustrative example of the blending polymer includes a heretofore known novolak resin and a polymer which is obtained from a compound shown by the general formula (1-1) or (1-2) as the raw material while having a different composition. Blending with the polymer like this affords a role to improve coating properties by a spin coating method and filling-up properties of a non-planar substrate. In addition, a material having high carbon density and high etching resistance may be chosen.

Illustrative example of the heretofore known novolak resin includes dehydration condensation products of formaldehyde with phenol, o-cresol, m-cresol, p-cresol, 2,3-dimethyl phenol, 2,5-dimethyl phenol, 3,4-dimethyl phenol, 3,5-dimethyl phenol, 2,4-dimethyl phenol, 2,6-dimethyl phenol, 2,3,5-trimethyl phenol, 3,4,5-trimethyl phenol, 2-t-butyl phenol, 3-t-butyl phenol, 4-t-butyl phenol, 2-phenyl phenol, 3-phenyl phenol, 4-phenyl phenol, 3,5-diphenyl phenol, 2-naphthyl phenol, 3-naphthyl phenol, 4-naphthyl phenol, 4-trityl phenol, resorcinol, 2-methyl resorcinol, 4-methyl resorcinol, 5-methyl resorcinol, catechol, 4-t-butyl catechol, 2-methoxy phenol, 3-methoxy phenol, 2-propyl phenol, 3-propyl phenol, 4-propyl phenol, 2-isopropyl phenol, 3-isopropyl phenol, 4-isopropyl phenol, 2-methoxy-5-methyl phenol, 2-t-butyl-5-methyl phenol, pyrogallol, thymol, isothymol, 4,4'-(9H-fluorene-9-ylidene)bisphenol, 2,2' dimethyl-4,4'-(9H-fluorene-9-ylidene)bisphenol, 2,2' diallyl-4,4'-(9H-fluorene-9-ylidene)bisphenol, 2,2' difluoro-4,4'-(9H-fluorene-9-ylidene)bisphenol, 2,2' diphenyl-4,4'-(9H-fluorene-9-ylidene)bisphenol, 2,2' dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-dial, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, and 7-methoxy-2-naphthol; dihydroxy naphthalene such as 1,5-dihydroxy naphthalene, 1,7-dihydroxy naphthalene, and 2,6-dihydroxy naphthalene; methyl-3-hydroxy-naphthalene-2-carboxylate, hydroxyl indene, hydroxyl anthracene, bisphenol, and trisphenol: polystyrene, polyhydroxy styrene, polyvinyl naphthalene, polyhydroxy naphthalene, polyvinyl anthracene, polyvinyl carbazole, polyindene, polyacenaphthylene, polynorbornene, polycyclodecene, polytetracyclodecene, polynortricyclene, poly(meth)acrylate, and a copolymer of them.

In addition, what can be blended therewith are: resin compounds such as a nortricyclene copolymer, hydrogenated naphthol novolak resin, naphthol dicyclopentadiene copolymer, phenol dicyclopentadiene copolymer, fluorene bisphenol novolak, an acenaphthylene copolymer, an indene copolymer, a hydroxyphenyl-containing fullerene, a bisphenol compound and its novolak resin, a dibisphenol compound and its novolak resin, an adamantane phenol novolak resin, a hydroxyl vinylnaphthalene copolymer, a bisnaphthol compound and its novolak resin, ROMP polymer, and a tricyclopentadiene copolymer; and a resin compound of a fullerene.

Amount of the blending compound or of the blending polymer is 0 to 1,000 parts by mass, or preferably 0 to 500 parts by mass, relative to 100 parts by mass of a compound shown, such as for example, by the general formula (3).

The resist underlayer film composition of the present invention may contain a crosslinking agent with a purpose to facilitate a crosslinking reaction inside the resist underlayer film by heat treatment and so on after application thereof to a substrate and so on, so that the resist underlayer film may become denser thereby expressing a high solvent resistance, namely in order not to reduce film thickness of the underlayer film when a film is laminated on the underlayer film, nor to occur intermixing between the films so that diffusion of a low-molecular weight component to the resist upper layer film may be avoided.

A crosslinking agent described in paragraphs [0055] to [0060] of the Japanese Patent Laid-Open Application No. 2007-199653 may be used in the present invention.

In the present invention, an acid generator may be added to further facilitate a thermal crosslinking reaction. An acid generator generates an acid by thermal decomposition or by light irradiation; and any of such generators may be added. Specifically, those materials described in paragraphs [0061] to [0085] of the Japanese Patent Laid-Open Application No. 2007-199653 may be added.

In addition, a basic compound to improve storage stability may be added into the resist underlayer film composition used in patterning process of the present invention as will be described later. The basic compound plays a role as a quencher to an acid, so that a crosslinking reaction by the acid that is generated faintly from an acid generator in the underlayer film composition may be prevented from progressing.

Basic compounds specifically described in paragraphs to [0090] of the Japanese Patent Laid-Open Application No. 2007-199653 may be added.

In addition, in preparation of the resist underlayer film composition of the present invention, an organic solvent may be used.

The organic solvent usable in the resist underlayer film composition of the present invention is not particularly limited, provided that the organic solvent can dissolve the base polymer, the acid generator, the crosslinking agent, and other additives. Specifically, those solvents described in paragraphs [0091] to [0092] of the Japanese Patent Laid-Open Application No. 2007-199653 may be added.

Still in addition, in the resist underlayer film composition of the present invention, a surfactant may be added to improve applicability in spin coating.

Surfactants described in paragraphs [0165] to [0166] of the Japanese Patent Laid-Open Application No. 2008-111103 may be used.

Illustrative example of the patterning process of the present invention using the resist underlayer film composition prepared as mentioned above includes the following.

In the present invention, provided is a patterning process, wherein a resist underlayer film is formed on a body to be processed by using the resist underlayer film composition of the present invention, a resist middle layer film is formed on the resist underlayer film by using a silicon-containing resist middle layer film composition, a resist upper layer film is formed on the resist middle layer film by using a resist upper layer film composition which is a photoresist composition, a circuit pattern is formed on the resist upper layer film, the resist middle layer film is etched by using the resist upper layer film formed with the pattern as a mask, the resist underlayer film is etched by using the resist middle layer film formed with the pattern as a mask, and further, the body to be processed is etched by using the resist underlayer film formed with the pattern as a mask, whereby a pattern is formed on the body to be processed.

In the process of forming the resist underlayer film in the patterning process of the present invention, similarly to the photoresist, the foregoing resist underlayer film composition is applied onto a body to be processed by a spin coating method and the like. By using a spin coating method and the like, an excellent filling-up property can be obtained.

After spin coating, a solvent is evaporated, and then, heat treatment (PAB) is carried out to facilitate a crosslinking reaction thereby forming a dense film so that mixing of the resist upper layer film with the resist middle layer film may not occur. The heat treatment is carried out in the temperature range of above 100° C. to 600° C. or lower and with the time in the range of 10 to 600 seconds, or preferably 10 to 300 seconds. The heat treatment temperature is preferably in the range of 150° C. or higher to 500° C. or lower, or more preferably 180° C. or higher to 400° C. or lower. In view of effects on device damage and wafer deformation, upper limit of the heatable temperature in a lithography wafer process is 500° C. or lower, or preferably 450° C. or lower. The underlayer film composition of the present invention is particularly suitable if the PAB 250° C. or lower is necessary for the reason of heat resistance and so on of the substrate to be processed.

Atmosphere during the heat treatment may be air; but it is preferable that an inert gas, such as $N_2$, Ar, and He, be charged thereinto to reduce oxygen so that oxidation of the resist underlayer film may be prevented from occurring. To prevent the oxidation from occurring, oxygen concentration needs to be controlled, preferably in the level of 1,000 ppm or lower, or more preferably 100 ppm or lower. Prevention of oxidation of the resist underlayer film during heat treatment from occurring is desirable because increase in absorption and decrease in etching resistance can be avoided.

Meanwhile, thickness of the resist underlayer film may be arbitrarily selected, though the range thereof is preferably 30 to 20,000 nm, or in particular 50 to 15,000 nm. In the case of the three-layer process, after forming the resist underlayer film, the silicon-containing resist middle layer film may be formed thereonto, followed by formation of the resist upper layer film not containing a silicon atom (monolayer resist film).

As to the silicon-containing resist middle layer film in the three-layer process as mentioned above, a middle layer film based on polysiloxane is used preferably. When this silicon-containing resist middle layer film is made to have an effect as an antireflective film, reflection can be suppressed. Specifically, silicon-containing resist middle layer films obtained from compositions described in the Japanese Patent Laid-Open Publication No. 2004-310019, the Japanese Patent Laid-Open Publication No. 2007-302873, the Japanese Patent Laid-Open Publication No. 2009-126940, and so on, may be mentioned.

Especially in photo-exposure to the light of 193 nm wavelength, when a resist underlayer film using a composition which contains many aromatic groups and has a high substrate etching resistance is used, the k-value and the substrate reflectance become high; but the substrate reflectance can be suppressed to 0.5% or lower by introduction of the resist middle layer film.

In the case that the inorganic hard mask middle layer film is formed on the resist underlayer film, a silicon oxide film, a silicon nitride film, a silicon oxynitride film (SiON film), an amorphous silicon film, or the like is formed by a CVD method, an ALD method, and so on. A method for forming a silicon nitride film is described in the Japanese Patent Laid-Open Publication No. 2002-334869, the International Patent Laid-Open Publication No. 2004/066377, and so on. Thickness of the inorganic hard mask is 5 to 200 nm, or preferably 10 to 100 nm, wherein among the foregoing films, a SiON film, which is highly effective as an antireflective film, is most preferably used. Because temperature of the substrate during the time of forming a SiON film is 300 to 500° C., the underlayer film needs to be endurable against the temperature of 300 to 500° C. The resist underlayer film composition of the present invention has high heat resistance so that it is endurable against the high temperature of 300 to 500° C.; and thus, a combination of the inorganic hard mask formed by a CVD method or an ALD method with the resist underlayer film formed by a spin coating method may be possible.

A photoresist film may be formed as the resist upper layer film on the resist middle layer film or the inorganic hard mask middle layer film as mentioned above; but also an organic antireflective film (BARC) may be formed on the resist middle layer film or on the inorganic hard mask middle layer film by spin coating, followed by formation of the photoresist film thereonto.

Especially in the case that the inorganic hard mask middle layer film of a SiON film and the like is used, reflection can be suppressed even in an immersion photo-exposure with a high NA of beyond 1.0 by virtue of two films of the SiON film and the BARC. Another merit of forming the BARC resides in that a footing profile of the photoresist pattern immediately above the SiON film can be suppressed.

The resist upper layer film in the three-layer resist film may be any of a positive-type and a negative-type, wherein the same composition as a generally used photoresist composition may be used. In the case that the resist upper layer film is formed by the foregoing photoresist composition, a spin coating method is preferably used, similarly to the case of forming the resist underlayer film. After spin coating of the photoresist composition, heat treatment is carried out for film formation, preferably in the temperature range of 60 to 180° C. for the time in the range of 10 to 300 seconds. Thereafter, photo-exposure, heat treatment (post-exposure bake; hereinafter, referred to as "PEB"), and development are carried out according to respective conventional methods to obtain a resist pattern. Meanwhile, thickness of the resist upper layer film is not particularly limited, though the thickness in the range of 30 to 500 nm, in particular 50 to 400 nm, is preferable.

As to the foregoing patterning process of the resist upper layer film, patterning may be done by a method such as a photolithography method with the wavelength range of 10 nm or longer to 300 m or shorter, a direct drawing method by an electron beam, and a nanoimprinting method, or by a combination of them.

Illustrative example of the development method in the patterning process as mentioned above includes an alkaline development and a development by an organic solvent.

Then, etching is carried out by using the obtained resist pattern as a mask. Etching of the resist middle layer film in the three-layer process, especially etching of the inorganic hard mask, is carried out by using a fluorocarbon gas and the resist pattern as a mask. Then, etching of the resist underlayer film is carried out by using an oxygen gas or a hydrogen gas and by using the resist middle layer film pattern, especially the inorganic hard mask pattern, as a mask.

Subsequent etching of the body to be processed may be carried out also by a conventional method; for example, etching is carried out by using a gas mainly comprised of a CF gas in the case that the substrate is $SiO_2$, SiN, or a silica-type low-dielectric insulating film, while, in the case of p-Si, Al, or W, etching is carried out by a gas mainly comprised of a chlorine-type gas and a bromine-type gas. In the case that processing of the substrate is carried out by etching with a CF gas, the silicon-containing middle layer film in the three-layer process is removed at the same time as processing of the substrate. In the case that etching of the substrate is carried out by a chlorine-type gas or a bromine-type gas, removal of the silicon-containing middle layer film needs to be carried out separately by dry etching with a CF gas after processing of the substrate.

The resist underlayer film formed by using the resist underlayer film composition of the present invention has a characteristic of excellent etching resistance to these bodies to be processed.

Meanwhile, as to the body to be processed, the one such as those having, on a substrate of a semiconductor device (substrate), any of the following metal films (hereinafter, "film to be processed")—a metal film, a metal carbide film, a metal oxide film, a metal nitride film, and a metal oxynitride film—may be used, wherein illustrative example of the said metal includes silicon, titanium, tungsten, hafnium, zirconium, chromium, germanium, copper, aluminum, and iron, or an alloy of these metals.

The substrate is not particularly restricted; a material different from those of the film to be processed, such as Si, α-Si, p-Si, $SiO_2$, SiN, SiON, W, TiN, and Al, may be used.

As to the film to be processed, a low-k film and its topper film, such as films of Si, $SiO_2$, SiON, SiN, p-Si, α-Si, W, W—Si, Al, Cu, and Al—Si, may be used, wherein the film may be formed with thickness of usually 50 to 10,000 nm, in particular 100 to 5,000 nm.

One example of the patterning process of the present invention (three-layer process) will be specifically shown as following with referring to FIG. 1.

In the case of the three-layer process, as shown in FIG. 1 (A), after the resist underlayer film 3 is formed by the present invention on the film to be processed 2 that is laminated on the substrate 1, the resist middle layer film 4 is formed, and then, the resist upper layer film 5 is formed thereonto.

Then, as shown in FIG. 1 (B), the intended part 6 of the resist upper layer film is exposed to a light, which is then followed by PEB and development to form the resist pattern 5a (FIG. 1 (C)). By using this resist pattern 5a thus obtained as a mask, the resist middle layer film 4 is processed by etching with a CF gas to form the resist middle layer film pattern 4a (FIG. 1 (D)). After removal of the resist pattern 5a, by using this resist middle layer film pattern 4a thus obtained as a mask, the resist underlayer film 3 is etched by an oxygen plasma method to form the resist underlayer film pattern 3a (FIG. 1 (E)). Further, after removal of the resist middle layer film pattern 4a, the film to be processed 2 is processed by etching using the resist underlayer film pattern 3a as a mask to form the pattern 2a on the substrate (FIG. 1 (F)).

Meanwhile, in the case that the inorganic hard mask middle layer film is used, the resist middle layer film 4 is the inorganic hard mask middle layer film 4, and the resist middle layer film pattern 4a is the inorganic hard mask middle layer film pattern 4a.

In the case that BARC is formed, BARC is formed between the resist middle layer film 4 (or inorganic hard mask middle layer film) and the resist upper layer film 5. Etching of BARC may be carried out continuously in advance of etching of the resist middle layer film 4 (or inorganic hard mask middle layer film), or etching of the resist middle layer film 4 (or inorganic hard mask middle layer film) may be carried out by changing an etching equipment and so on after only BARC is etched.

EXAMPLES

Hereinafter, the present invention will be specifically explained by showing Synthesis Examples, Comparative Synthesis Examples, Examples, and Comparative Examples; but the present invention is not restricted by these descriptions.

Meanwhile, molecular weights were measured by a gel permeation chromatography (GPC).

Weight-average molecular weight (Mw) and number-average molecular weight (Mn) in terms of polystyrene were measured, and then, dispersity (Mw/Mn) was obtained therefrom.

Synthesis Example 1

Condensed Body of 4-hydroxybenzaldehyde with the Condensed Body of Resorcinol with Formaldehyde (Two-Step Preparation Method)

Into a 100-mL three-necked flask were weighed 5.00 g of Polymer 9 synthesized by the later-mentioned Comparative Synthesis Example 4, 1.00 g (8.19 mmole) of 4-hydroxybenzaldehyde, and 9.00 g of propylene glycol monomethyl ether (PGME); and then, they were heated to 60° C. with stirring. Thereinto was gradually added 1.25 g of a PGME solution of p-toluenesulfonic acid monohydrate with the concentration thereof being 20% by mass; and then, the reaction mixture was stirred for one hour. The temperature thereof was raised to 80° C.; and then, the stirring was continued for further 16.5 hours. After 24 g of ultrapure water and 30 g of ethyl acetate were added into the reaction solution, the resulting mixture was transferred to a separation funnel and then washed with 24 g of ultrapure water for 9 times to remove the acid catalyst and a metal impurity. After the organic layer thereby obtained was concentrated under reduced pressure till 9.0 g, ethyl acetate was added thereinto to obtain 19.5 g of a solution, which was then added with 29.3 g of n-hexane. The upper n-hexane layer and the lower layer of a high-concentration polymer solution were separated, and this upper layer was removed. After the same procedure was repeated twice, the polymer solution thereby obtained was concentrated and then dried under vacuum at 80° C. for 15 hours to obtain 5.7 g of Polymer 1 as a reddish brown solid. The weight-average molecular weight Mw and the dispersity Mw/Mn thereof were 5,100 and 3.95, respectively. From the $^1$H-NMR analysis, ratio of the repeating units of Polymer 1 (molar ratio) was obtained as follows (hereinafter, same is applied to Synthesis Examples and Comparative Synthesis Examples).

polymer 1

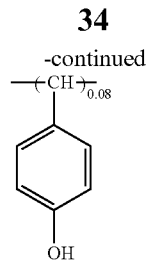

Synthesis Example 2

Condensed Body of 4-hydroxybenzaldehyde with the Condensed Body of Resorcinol with Formaldehyde (One-Pot Preparation Method)

Into a 500-mL three-necked flask were weighed 30.00 g (272.5 mole) of resorcinol, 7.50 g of a PGME solution of p-toluenesulfonic acid monohydrate with the concentration thereof being 20% by mass, and 54.00 g of PGME; and then, they were heated to 80° C. with stirring. Thereinto was gradually added 17.69 g of 37% formalin (218.0 mmole of formaldehyde); and then, the resulting mixture was stirred for 7 hours. Into the reaction mixture was gradually added a solution which was obtained by dissolving 14.97 g (122.6 mmole) of 4-hydroxybenzaldehyde into 30.00 g of PGME; and then, this mixture was stirred at 80° C. for further 16 hours. The reaction solution thereby obtained was diluted with 30 g of PGME and then added with 318 g of ultrapure water. The upper water layer and the lower layer of a high-concentration polymer solution were separated, and this upper layer was removed. After the same procedure was repeated once more, 140 g of ethyl acetate was added to the polymer solution thus obtained; and then, the mixture was transferred to a separation funnel. After washing with 100 g of ultrapure water was repeated for 10 times to remove the acid catalyst and a metal impurity, the organic layer thereby obtained was diluted with ethyl acetate to obtain 294.0 g of a polymer solution. Of this, 86.3 g was concentrated and then dried under vacuum at 60° C. for 18 hours to obtain 8.29 g of Polymer 2 as a black solid. The remaining 207.7 g was added with 200 g of propylene glycol monomethyl ether acetate (PGMEA) and then concentrated to remove components of lower boiling points to obtain 160.0 g of a PGMEA solution of Polymer 2 with the concentration thereof being 12.5% by mass. The weight-average molecular weight Mw and the dispersity Mw/Mn of Polymer 2 were 18,100 and 5.00, respectively.

polymer 2

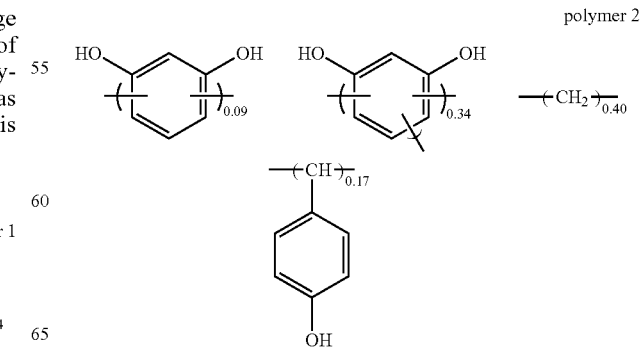

Synthesis Example 3

Condensed Body of 4-hydroxybenzaldehyde with the Condensed Body of Resorcinol with Formaldehyde (One-Pot Preparation Method)

Into a 200-mL three-necked flask were weighed 20.00 g (181.6 mole) of resorcinol, 5.00 g of a PGME solution of p-toluenesulfonic acid monohydrate with the concentration thereof being 20% by mass, and 36.00 g of PGME; and then, they were heated to 80° C. with stirring. Thereinto was gradually added 11.79 g of 37% formalin (145.3 mmole of formaldehyde); and then, the resulting mixture was stirred for 16 hours and 20 minutes. Into the reaction mixture was gradually added a solution which was obtained by dissolving 4.44 g (36.3 mmole) of 4-hydroxybenzaldehyde into 9.00 g of PGME; and then, this mixture was stirred at 80° C. for further 10 hours and 30 minutes. Thereinto was gradually added a solution which was obtained by dissolving 2.22 g (18.2 mmole) of 4-hydroxybenzaldehyde into 4.50 g of PGME; and then, this mixture was stirred at 80° C. for further 19 hours. After 100 g of ultrapure water and 150 g of ethyl acetate were added to the reaction solution, the resulting mixture was transferred to a separation funnel, and then washed with 80 g of ultrapure water for 10 times to remove the acid catalyst and a metal impurity. After the organic layer thereby obtained was concentrated under reduced pressure till 84 g, ethyl acetate was added thereinto to obtain 109 g of a solution. To this was added 82 g of n-hexane to separate the upper n-hexane layer and the lower layer of a high-concentration polymer solution; and then, this upper layer was removed. After the same operation was repeated twice, the polymer solution thereby obtained was concentrated and then dried under vacuum at 80° C. for 15 hours to obtain 28.4 g of Polymer 3 as a reddish brown solid. The weight-average molecular weight Mw and the dispersity Mw/Mn thereof were 1,800 and 1.94, respectively.

polymer 3

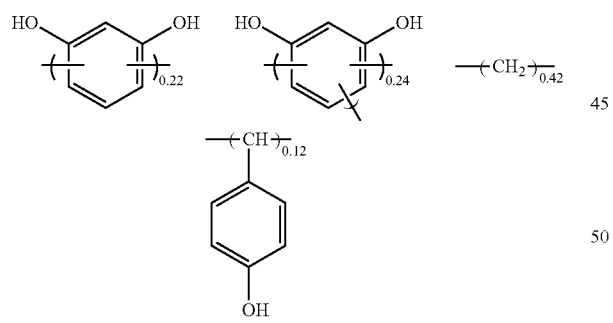

Synthesis Example 4

Condensed Body of 6-hydroxy-2-naphthaldehyde with the Condensed Body of Resorcinol with Formaldehyde Into a 200-mL three-necked flask were weighed 10.0 g (90.8 mmole) of resorcinol, 5.90 g of 37% formalin (72.7 mmole of formaldehyde), and 18.0 g of PGME; and then, they were heated to 80° C. with stirring. Thereinto was added 5.0 g of a PGME solution of p-toluenesulfonic acid monohydrate with the concentration thereof being 20% by mass; and then, the resulting mixture was stirred. At 2 hours and 30 minutes after the end of gradual addition of the acid catalyst, a solution which was obtained by dissolving 3.13 g (18.2 mmole) of 6-hydroxy-2-naphthaldehyde into 18 g of PGME was added thereinto; and at 17 hours thereafter, a solution which was obtained by dissolving 1.56 g (9.1 mmole) of 6-hydroxy-2-naphthaldehyde into 9 g of PGME was added thereinto, the both additions being done gradually at 80° C. with stirring. After stirring was continued for further 6 hours and 40 minutes, the reaction solution was diluted with 200 mL of ethyl acetate. The resulting mixture was transferred to a separation funnel, and then washed with 50 g of ultrapure water for 15 times to remove the acid catalyst and a metal impurity. The solution thereby obtained was concentrated under reduced pressure and then dried under vacuum at 65° C. for 15 hours to obtain 16.7 g of Polymer 4 as a reddish brown solid. The weight-average molecular weight Mw and the dispersity Mw/Mn thereof were 7,000 and 4.89, respectively.

polymer 4

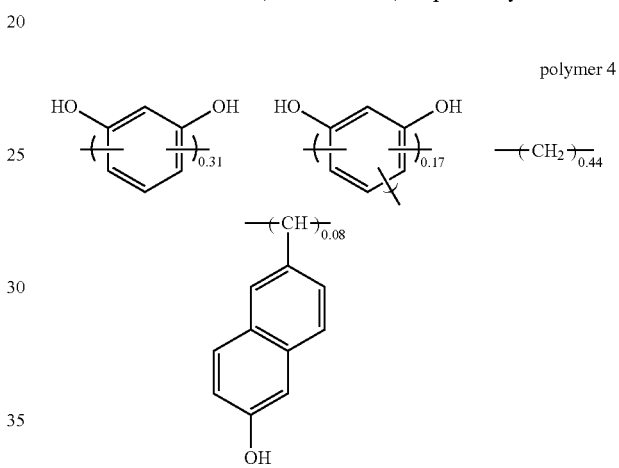

Synthesis Example 5

Condensed Body of 6-hydroxy-2-naphthaldehyde with the Condensed Body of 1,2,3-trihydroxybenzene with Formaldehyde Into a 200-mL three-necked flask were weighed 10.0 g (79.3 mmole) of 1,2,3-trihydroxybenzene, 5.15 g of 37% formalin (63.4 mmole of formaldehyde), and 18.0 g of PGME; and then, they were heated to 80° C. with stirring. Thereinto was added 2.5 g of a PGME solution of p-toluenesulfonic acid monohydrate with the concentration thereof being 20% by mass; and then, stirring thereof was continued. At 2 hours and 30 minutes after the end of gradual addition of the acid catalyst, a solution which was obtained by dissolving 4.1 g (23.8 mmole) of 6-hydroxy-2-naphthaldehyde into 18.0 g of PGME was gradually added thereinto with heating at 80° C. After 7 hours and 50 minutes of stirring, the reaction solution was diluted with 200 mL of ethyl acetate. The resulting mixture was transferred to a separation funnel, and then washed with 50 g of ultrapure water for 12 times to remove the acid catalyst and a metal impurity. The solution thereby obtained was concentrated under reduced pressure and then dried under vacuum at 65° C. for 15 hours to obtain 14.1 g of Polymer 5 as a deep blue solid. The weight-average molecular weight Mw and the dispersity Mw/Mn thereof were 1,300 and 1.58, respectively.

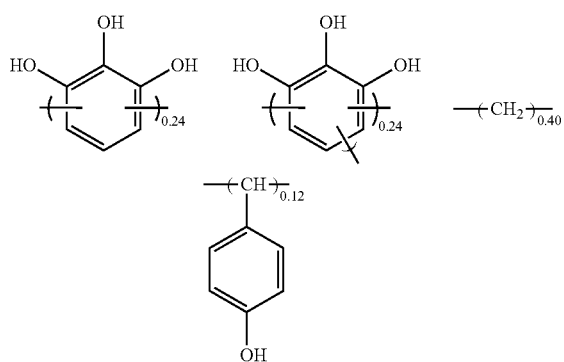

polymer 5

Comparative Synthesis Example 1

Condensed Body of Resorcinol, Formaldehyde, and 4-hydroxybenzaladehyde

Into a 200-mL three-necked flask were weighed 10.0 g (90.8 mmole) of resorcinol, 5.90 g of 37% formalin (72.3 mmole of formaldehyde), 4.99 g (40.9 mmole) of 4-hydroxybenzaldehyde, and 36.0 g of PGME all at once; and then, they were heated to 65° C. with stirring. After 5.00 g of a PGME solution of p-toluenesulfonic acid monohydrate with the concentration thereof being 20% by mass was added thereinto, the resulting mixture was stirred with heating at 80° C. for 18 hours and 20 minutes. After the reaction solution was diluted with 200 mL of ethyl acetate, the resulting mixture was transferred to a separation funnel, and then washed with 60 g of ultrapure water for 7 times to remove the acid catalyst and a metal impurity. The solution thereby obtained was concentrated under reduced pressure and then dried under vacuum at 65° C. for 15 hours to obtain 16.5 g of Polymer 6 as a brownish black solid. The weight-average molecular weight Mw and the dispersity Mw/Mn thereof were 4,500 and 3.90, respectively.

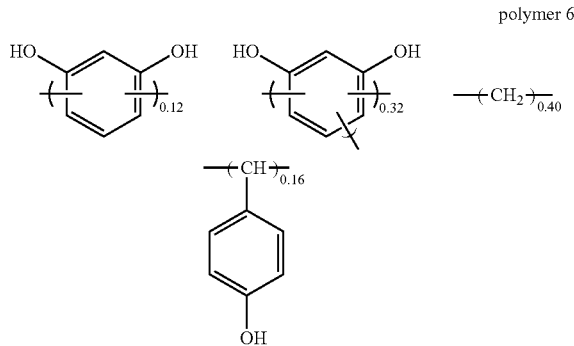

polymer 6

When a mixture of 1.0 g of Polymer 6 and 9.0 g of PGMEA was stirred at room temperature, small amount of insoluble matters was confirmed. Alternatively, when a mixture of 1.0 g of Polymer 6 and 9.0 g of cyclohexanone was stirred at room temperature, small amount of insoluble matters was confirmed similarly.

Comparative Synthesis Example 2

Condensed Body of Resorcinol with 4-hydroxybenzaladehyde

Into a 200-mL three-necked flask were weighed 10.0 g (90.8 mmole) of resorcinol, 11.1 g (90.8 mmole) of 4-hydroxybenzaldehyde, and 36.0 g of PGME; and then, they were heated to 70° C. with stirring. After 2.5 g of a PGME solution of p-toluenesulfonic acid monohydrate with the concentration thereof being 20% by mass was added thereinto, the resulting mixture was stirred with heating at 80° C. for 6 hours and 30 minutes. Immediately after gradual addition of the acid catalyst, yellow precipitates were formed exothermically. After completion of the reaction, the reaction mixture was diluted with 200 mL of ethyl acetate; and then, precipitated crystals in the suspension state were filtrated with Kiriyama funnel. The separated crystals were washed with 200 mL of methanol twice and then dried under vacuum at 65° C. for 15 hours to obtain 14.4 g of Polymer 7 as an orange solid. The weight-average molecular weight Mw and the dispersity Mw/Mn thereof were 700 and 1.03, respectively.

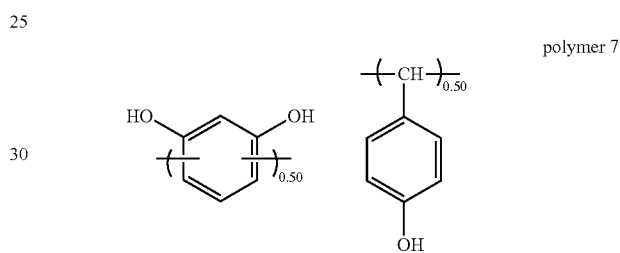

polymer 7

When a mixture of 1.0 g of Polymer 7 and 9.0 g of PGMEA was stirred at room temperature, the polymer could not be dissolved. Alternatively, when a mixture of 1.0 g of Polymer 7 and 9.0 g of cyclohexanone was stirred at room temperature, the polymer could not be dissolved either.

Comparative Synthesis Example 3

Condensed Body of Resorcinol with 6-hydroxy-2-naphthaladehyde

Into a 200-mL three-necked flask were weighed 10.0 g (90.8 mmole) of 1,3-dihydroxybenzene, 15.6 g (90.8 mmole) of 6-hydroxy-2-naphthaladehyde, and 72.0 g of PGME; and then, they were heated to 70° C. with stirring. After 2.5 g of a PGME solution of p-toluenesulfonic acid monohydrate with the concentration thereof being 20% by mass was added thereinto, the resulting mixture was stirred with heating at 80° C. for 7 hours. With this, orange precipitates were separated about one hour after start of stirring. After the reaction mixture in the state of suspension was diluted with 225 g of ethyl acetate and 120 g of tetrahydrofurane thereby forming a homogeneous solution, this solution was transferred to a separation funnel and then washed with 50 g of ultrapure water for 12 times to remove the acid catalyst and a metal impurity. The obtained solution was concentrated under reduced pressure till 37.9 g and then added with 200 mL of methanol to obtain a suspension solution. The suspension solution was stirred as it is; and then, crystals were collected by filtration with Kiriyama funnel. Separated crystals were washed with 100 mL of methanol and then dried under vacuum at 65° C. for 15 hours to obtain 12.0 g of Polymer 8 as a brown solid. The weight-average molecular weight Mw and the dispersity Mw/Mn thereof were 700 and 1.08, respectively.

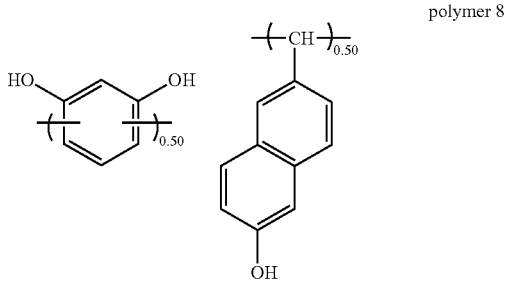

polymer 8

When a mixture of 1.0 g of Polymer 8 and 9.0 g of PGMEA was stirred at room temperature, the polymer could not be dissolved. Alternatively, when a mixture of 1.0 g of Polymer 8 and 9.0 g of cyclohexanone was stirred at room temperature, the polymer could not be dissolved either.

Comparative Synthesis Example 4

Condensed Body of Resorcinol with Formaldehyde

Into a 500-mL three-necked flask were weighed 40.00 g (363.3 mmole) of resorcinol, 10.00 g of a PGME solution of p-toluenesulfonic acid monohydrate with the concentration thereof being 20% by mass, and 72.00 g of PGME; and then, they were heated to 80° C. with stirring. After 23.59 g of 37% formalin (290.6 mmole of formaldehyde) was added thereinto, the resulting mixture was stirred for 11 hours. After 160 g of ultrapure water and 200 g of ethyl acetate were added to the reaction solution, the resulting mixture was transferred to a separation funnel and then washed with 150 g of ultrapure water for 10 times to remove the acid catalyst and a metal impurity. The obtained organic layer was concentrated under reduced pressure till 76 g and then added with ethyl acetate to obtain a solution with amount of 150 g. Then, 217 g of n-hexane was added thereinto, whereby separating into the upper n-hexane layer and the lower layer of a high-concentration polymer solution; and then, this upper layer was removed. After the same operation was repeated twice, the obtained polymer solution was concentrated and then dried under reduced pressure at 80° C. for 13 hours to obtain 18.3 g of Polymer 9 as a reddish brown solid. The weight-average molecular weight Mw and the dispersity Mw/Mn thereof were 800 and 1.27, respectively.

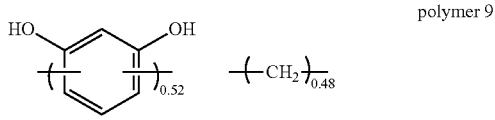

polymer 9

Comparative Synthesis Example 5

Condensed Body of Resorcinol with 2-naphthaladehyde

Into a 100-mL three-necked flask were weighed 5.00 g (45.4 mmole) of resorcinol, 7.10 g (45.4 mmole) of 2-naphthaladehyde, and 36.0 g of PGME; and then, they were heated to 80° C. with stirring. After 1.25 g of a PGME solution of p-toluenesulfonic acid monohydrate with the concentration thereof being 20% by mass was added thereinto, the resulting mixture was stirred for 5 hours and 30 minutes. With this, yellow precipitates were separated about one hour after start of stirring. After the reaction mixture in the state of suspension was diluted with 150 mL of ethyl acetate, this solution was transferred to a separation funnel and then washed with 50 g of ultrapure water for 6 times to remove the acid catalyst and a metal impurity. The obtained solution was concentrated under reduced pressure; and then, the resulting residue was suspended by adding 200 mL of a mixture solvent of 1/1 acetone/diisopropy ether (volume ratio) to obtain a suspension solution for solid-liquid washing. After the suspension solution was stirred for a while, a sold was collected by filtration with Kiriyama funnel and then washed further with 100 mL of the mixture solvent of 1/1 acetone/diisopropy ether (volume ratio). After drying under vacuum at 65° C. for 15 hours, 6.9 g of Polymer 10 was obtained as a pink solid. The weight-average molecular weight Mw and the dispersity Mw/Mn thereof were 700 and 1.07, respectively.

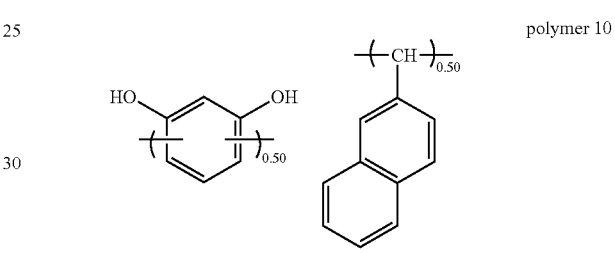

polymer 10

When a mixture of 1.0 g of Polymer 10 and 9.0 g of PGMEA was stirred at room temperature, the polymer could not be dissolved. Alternatively, when a mixture of 1.0 g of Polymer 10 and 9.0 g of cyclohexanone was stirred at room temperature, the polymer could not be dissolved either.

Comparative Synthesis Example 6

Condensed Body of 1,2,3-trihydroxybenzene with Formaldehyde

Into a 200-mL three-necked flask were weighed 20.0 g (159 mmole) of 1,2,3-trihydroxybenzene, 10.3 g of 37% formalin (127 mmole of formaldehyde), and 36.0 g of PGME; and then, they were heated to 65° C. with stirring. After 5.00 g of a PGME solution of p-toluenesulfonic acid monohydrate with the concentration thereof being 20% by mass was added thereinto, the resulting mixture was stirred with heating at 80° C. for 7 hours. After the reaction solution was diluted with 200 mL of ethyl acetate, the resulting mixture was transferred to a separation funnel, and then washed with 60 g of ultrapure water for 16 times to remove the acid catalyst and a metal impurity. During the time of washing with water, the aqueous layer became a reddish black so that it was observed that the polymer was distributed thereinto. The organic layer thereby obtained was concentrated under reduced pressure and then dried under vacuum at 65° C. to obtain 6.7 g of Polymer 11 as a brownish black solid. The weight-average molecular weight Mw and the dispersity Mw/Mn thereof were 800 and 1.14, respectively.

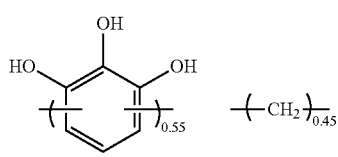

Comparative Synthesis Example 7

Condensed Body of 1,5-dihydroxynaphthalene with 6-hydroxy-2-naphthaladehyde

Into a 1000-mL flask were weighed 80 g (0.50 mole) of 1,5-dihydroxynaphthalene, 51.6 g (0.30 mole) of 6-hydroxy-2-naphthaladehyde, and 145 g of methyl cellosolve; and then, 20 g of a methyl cellosolve solution of p-toluenesulfonic acid monohydrate with the concentration thereof being 20% by mass was added thereinto at 70° C. with stirring. After the resulting mixture was stirred with heating at 85° C. for 6 hours, it was cooled to room temperature and then diluted with 800 mL of ethyl acetate. After this solution was transferred to a separation funnel, it was washed with 200 mL of deionized water repeatedly to remove the acid catalyst and a metal impurity. After the obtained solution was concentrated under reduced pressure, 600 mL of ethyl acetate was added to the resulting residue, followed by addition of 2,400 mL of hexane to precipitate a polymer. The precipitated polymer was filtrated, collected, and then dried under reduced pressure to obtain Polymer 12. The weight-average molecular weight Mw and the dispersity Mw/Mn thereof were 3,200 and 2.44, respectively.

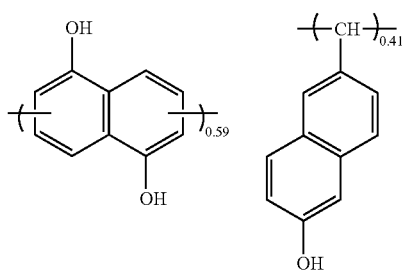

Comparative Synthesis Example 8

Condensed Body of 1,5-dihydroxynaphthalene, 6-hydroxy-2-naphthaladehyde, and Formaldehyde Polymer 13 was obtained by the reaction under the conditions similar to those of the above Comparative Synthesis Example 7 except that a mixture of 25.8 g of 6-hydroxy-2-naphthaladehyde and 4.5 g of paraformaldehyde was used as monomers in place of 51.6 g of 6-hydroxy-2-naphthaladehyde. The weight-average molecular weight Mw and the dispersity Mw/Mn thereof were 4,400 and 3.05, respectively.

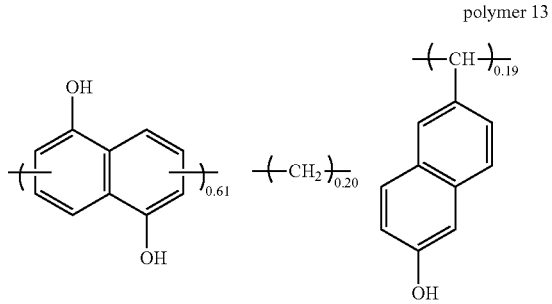

Comparative Synthesis Example 9

Condensed Body of 1,5-dihydroxynaphthalene with 2,3-dihydroxybenzaldehyde

Polymer 14 was obtained by the reaction under the conditions similar to those of the above Comparative Synthesis Example 7 except that 41.4 g of 2,3-dihydroxybenzaldehyde was used as the monomer in place of 51.6 g of 6-hydroxy-2-naphthaladehyde. The weight-average molecular weight Mw and the dispersity Mw/Mn thereof were 4,400 and 3.05, respectively.

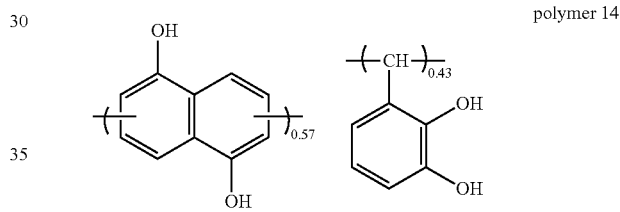

Comparative Synthesis Example 10

Condensed Body of 1,5-dihydroxynaphthalene with 4-hydroxybenzaldehyde

Into a 100-mL three-necked flask were weighed 10.0 g (62.4 mmole) of 1,5-dihydroxynaphthalene, 9.15 g (74.9 mmole) of 4-hydroxybenzaldehyde, and 36.0 g of PGME; and then, they were heated to 80° C. with stirring. After 2.50 g of a PGME solution of p-toluenesulfonic acid monohydrate with the concentration thereof being 20% by mass was added thereinto, the resulting mixture was stirred for 2.5 hours. The temperature thereof was raised to 117° C.; and then, the stirring was continued for 26.5 hours. After the reaction solution was diluted with 200 g of ethyl acetate, this solution was transferred to a separation funnel and then washed with 80 g of ultrapure water for 9 times to remove the acid catalyst and a metal impurity. The obtained organic layer was concentrated under reduced pressure to 55 g; and then, the resulting residue was added with 99 g of n-hexane. The upper n-hexane layer and the lower layer of a high-concentration polymer solution were separated, and this upper layer was removed. After the same operation was repeated, the obtained polymer solution was concentrated and dried under reduced pressure at 60° C. for 18 hours to obtain 18.29 g of Polymer 15 as a reddish brown solid. The weight-average molecular weight Mw and the dispersity Mw/Mn thereof were 2,500 and 1.85, respectively.

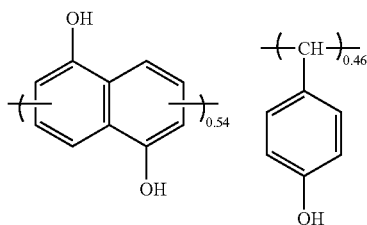

polymer 15

Examples and Comparative Examples

Preparation of Resist Underlayer Film Composition and Evaluation of Optical Characteristics Each of the foregoing Polymers 1 to 15 (20 parts by mass), 1 part by mass of an acid generator shown by the following AG 1, and 4 parts by mass of a crosslinking agent shown by the following CR 1 were dissolved in 100 parts by mass of PGMEA containing 0.1% by mass of FC-430 (manufactured by Sumitomo 3M Limited); and then, the resulting mixture was filtrated with a 0.1-μm filter made of a fluorinated resin to obtain each of the resist underlayer film compositions (SOL-1 to SOL-15).

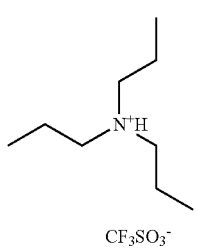

AG1

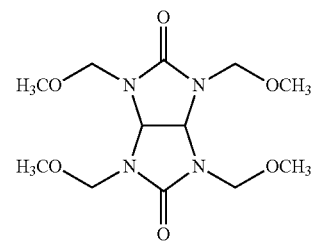

CR1

These underlayer film compositions were applied by spin coating onto a silicon substrate, and then subjected to heat treatment at 250° C. for 60 seconds to obtain each of coated films UDL-1 to UDL-5, UDL-9, and UDL-11 to UDL-15 having film thickness of 200 nm.

The n-value and the k-value of these films at the wavelength of 193 nm were measured with a spectroscopic ellipsometer with a variable incident light angle (VASE, manufactured by J. A. Woollam Co., Inc.). The results thereof are shown in Table 1. Further, a nanoindentation test was done to measure hardness of each of foregoing coated films with SA-2 nanoindenter instrument (manufactured by Toyo Corporation). The results thereof are also shown in Table 1.

TABLE 1

| | Underlayer film composition | Underlayer film | Used polymer | PGMEA Solubility | Optical characteristics (193 nm) | | Hardness (GPa) |
|---|---|---|---|---|---|---|---|
| | | | | | n-Value | k-Value | |
| Example 1 | SOL-1 | UDL-1 | Polymer 1 | Soluble | 1.55 | 0.71 | 0.90 |
| Example 2 | SOL-2 | UDL-2 | Polymer 2 | Soluble | 1.54 | 0.71 | 0.90 |
| Example 3 | SOL-3 | UDL-3 | Polymer 3 | Soluble | 1.55 | 0.70 | 0.88 |
| Example 4 | SOL-4 | UDL-4 | Polymer 4 | Soluble | 1.50 | 0.44 | 0.80 |
| Example 5 | SOL-5 | UDL-5 | Polymer 5 | Soluble | 1.49 | 0.42 | 0.81 |
| Comparative Example 1 | SOL-6 | Not formable | Polymer 6 | Some insolubles | Not measurable | Not measurable | Not measurable |
| Comparative Example 2 | SOL-7 | Not formable | Polymer 7 | Insoluble | Not measurable | Not measurable | Not measurable |
| Comparative Example 3 | SOL-8 | Not formable | Polymer 8 | Insoluble | Not measurable | Not measurable | Not measurable |
| Comparative Example 4 | SOL-9 | UDL-9 | Polymer 9 | Soluble | 1.54 | 0.69 | 1.00 |
| Comparative Example 5 | SOL-10 | Not formable | Polymer 10 | Insoluble | Not measurable | Not measurable | Not measurable |
| Comparative Example 6 | SOL-11 | UDL-11 | Polymer 11 | Soluble | 1.54 | 0.68 | 0.95 |
| Comparative Example 7 | SOL-12 | UDL-12 | Polymer 12 | Soluble | 1.40 | 0.25 | 0.75 |
| Comparative Example 8 | SOL-13 | DDL-13 | Polymer 13 | Soluble | 1.40 | 0.25 | 0.71 |

TABLE 1-continued

|  | Underlayer film composition | Underlayer film | Used polymer | PGMEA Solubility | Optical characteristics (193 nm) | | Hardness (GPa) |
|---|---|---|---|---|---|---|---|
|  |  |  |  |  | n-Value | k-Value |  |
| Comparative Example 9 | SOL-14 | UDL-14 | Polymer 14 | Soluble | 1.50 | 0.45 | 0.69 |
| Comparative Example 10 | SOL-15 | UDL-15 | Polymer 15 | Soluble | 1.51 | 0.46 | 0.62 |

As shown in Table 1, Polymers 7, 8, 10, which are condensed bodies of the benzene derivative shown by the general formula (1-1), were hardly soluble in PGMEA. SOL-7, SOL-8, and SOL-10 did not give homogeneous solutions so that n-value and k-value thereof could not be measured by forming a film therefrom. Polymer 6 also contained insoluble matters in PGMEA so that the 0.1-μm filter made of a fluorinated resin was clogged during filtration. As a result, n-value and k-value thereof could not be measured by forming a film from SOL-6.

UDL-1 to UDL-5, UDL-9, and UDL-11 to UDL-15 showed the refractive index n-value in the range of about 1.40 to 1.55 and the k-value in the range of 0.25 to 0.71, which values are within the intended ranges, indicating that they are suitable also as an antireflective film. Especially UDL-4 to UDL-5 and UDL-12 to UDL-15 showed almost near to the optimum optical characteristics thereby having sufficient antireflective effect also as the underlayer film of the three-layer process, so that excellent antireflective effect may be expected especially with the film thickness of 200 nm or more.

UDL-1 to UDL-5, UDL-9, and UDL-11, which are formed from the condensed bodies of the benzene derivative shown by the general formula (1-1), showed higher hardness values as compared with UDL-12 to UDL-15, which are formed from the condensed bodies of the naphthalene derivative. It is presumed that a polymer unit derived from the monomer shown by the general formula (1-1) has high electron density on the ring so that the crosslinking reaction is facilitated effectively during the time of film formation, thereby contributing to formation of a dense film. Among them, UDL-1 to UDL-3, UDL-9, and UDL-11 showed especially high hardness values, suggesting that these have especially excellent wiggling resistance during etching.

Evaluation of Solvent Resistance

With the assumption that a film is laminated on the underlayer film, solvent resistance of the underlayer film was evaluated. Each of the afore-mentioned underlayer film compositions SOL-1 to SOL-5, SOL-9, and SOL-11 to SOL-15 was applied on a silicon substrate by spin coating and then subjected to heat treatment at 195° C. or 250° C. for 60 seconds to form an underlayer film. On this underlayer film was applied PGMEA/PGME=30/70 (mass ratio) by spin coating; and then, heat treatment was done at 100° C. for 30 seconds to measure the change of film thickness before and after the treatment. These results are shown in Table 2.

TABLE 2

|  | Underlayer film composition | Film thickness change by solvent treatment (nm) | |
|---|---|---|---|
|  |  | Heat treatment temperature during film formation 195° C. | Heat treatment temperature during film formation 250° C. |
| Example 6 | SOL-1 | −1.2 | +0.1 |
| Example 7 | SOL-2 | −0.9 | +0.3 |
| Example 8 | SOL-3 | −1.7 | −0.1 |
| Example 9 | SOL-4 | −1.8 | −1.1 |
| Example 10 | SOL-5 | −1.5 | −1.2 |
| Comparative Example 11 | SOL-9 | −14.9 | −3.5 |
| Comparative Example 12 | SOL-11 | −15.4 | −3.6 |
| Comparative Example 13 | SOL-12 | −2.3 | −1.5 |
| Comparative Example 14 | SOL-13 | −2.6 | −1.8 |
| Comparative Example 15 | SOL-14 | −2.5 | −1.9 |
| Comparative Example 16 | SOL-15 | −3.0 | −1.7 |

As shown in Table 2, underlayer films formed from SOL-1 to SOL-5 and SOL-12 to SOL-15 have sufficient solvent resistance when these films are formed with the heat treatment temperature of 250° C. Especially underlayer films formed from SOL-1 to SOL-5 have sufficient solvent resistance even when these films are formed with the heat treatment temperature of 195° C., showing that the low temperature PAB process is applicable therein. On the contrary, underlayer films formed from SOL-9 and SOL-11 have low solvent resistance, suggesting that this is caused by low molecular weight of the polymers used in the underlayer film composition.

Patterning Tests

Each of the afore-mentioned SOL-1 to SOL-5, SOL-9, and SOL-11 to SOL-15 was applied by spin coating onto a 300-mm diameter Si wafer substrate formed with a SiO$_2$ film having 200 nm thickness; and then, it was subjected to heat treatment at 250° C. for 60 seconds to form a resist underlayer film having 200 nm thickness. On it was applied an ArF silicon-containing resist middle layer film polymer SOG 1 prepared by an usual method; and then, it was subjected to heat treatment at 220° C. for 60 seconds to form a resist middle layer film having 35 nm thickness. On it was further applied an ArF resist upper layer film composition (PR-1); and then, it was subjected to heat treatment at 105° C. for 60 seconds to form a resist upper layer film having 100 nm thickness. On the resist upper layer film was applied an immersion top coat material (TC-1); and then, it was subjected to heat treatment at 90° C. for 60 seconds to form a top coat having 50 nm thickness.

Meanwhile, structure of the ArF silicon-containing resist middle layer film polymer SOG 1 is as shown below.

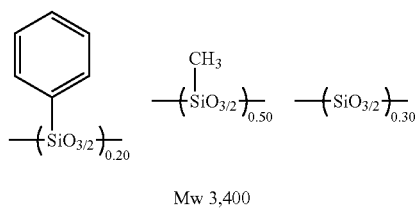

Mw 3,400

The upper layer film resist composition (PR-1) was prepared by dissolving the polymer, the acid generator, and the basic compound, with the composition as shown in Table 3, into a solvent containing 0.1% by mass of FC-430 (manufactured by Sumitomo 3M Limited), followed by filtering the thus obtained solution through a 0.1-μm filter made of a fluorinated resin.

TABLE 3

| | Polymer (parts by mass) | Acid generator (parts by mass) | Basic compound (parts by mass) | Solvent (parts by mass) |
|---|---|---|---|---|
| PR-1 | RP 1 (100) | PAG 1 (6.6) | Amine 1 (0.8) | PGMEA (2500) |

RP1
Mw 7,800

Amine 1

PAG1

The immersion top coat material (TC-1) was prepared by dissolving the polymer shown in Table 4 into an organic solvent, followed by filtering the thus obtained solution through a 0.1-μm filter made of a fluorinated resin.

TABLE 4

| | Polymer (parts by mass) | Organic solvent (parts by mass) |
|---|---|---|
| TC-1 | PP 1 (100) | Diisoamyl ether (2700) 2-Methyl-1-butanol (270) |

PP1
Mw 8,800 Mw/Mn 1.69

Then, after these were photo-exposed by using ArF immersion exposure instrument NSR-S610C (NA of 1.30, σ of 0.98/0.65, 35-degree dipole s-polarized illumination, and 6% half tone phase shift mask, manufactured by Nikon Corp.), heat treatment (PEB) was done at 100° C. for 60 seconds, which was then followed by development with an aqueous tetramethyl ammonium hydroxide (TMAH) solution with the concentration thereof being 2.38% by mass for 30 seconds to obtain a 43-nm 1:1 line-and-space pattern. A cross section form of the obtained pattern was measured by using electron microscope S-4800 (manufactured by Hitachi, Ltd.), and pattern roughness thereof was measured by using TDSEM S-9380 (manufactured by Hitachi High-Technologies Corp.). The results thereof are shown in Table 5.

TABLE 5

| | Underlayer film composition | Pattern form after development | Resist pattern roughness (nm) |
|---|---|---|---|
| Example 11 | SOL-1 | Vertical form | 4.0 |
| Example 12 | SOL-2 | Vertical form | 4.2 |
| Example 13 | SOL-3 | Vertical form | 4.1 |
| Example 14 | SOL-4 | vertical form | 2.5 |
| Example 15 | SOL-5 | Vertical form | 2.4 |
| Comparative Example 17 | SOL-9 | Vertical form | 4.3 |
| Comparative Example 18 | SOL-11 | Vertical form | 3.9 |
| Comparative Example 19 | SOL-12 | Vertical form | 2.6 |
| Comparative Example 20 | SOL-13 | Vertical form | 2.7 |
| Comparative Example 21 | SOL-14 | Vertical form | 2.6 |
| Comparative Example 22 | SOL-15 | Vertical form | 2.8 |

As shown in Table 5, the resist patterns of Examples 11 to 15 and Comparative Examples 17 to 22 after development were of a vertical form with the resist pattern roughness of about 4.0 or less, which is the level not practically causing a trouble. Especially, Examples 14 to 15 and Comparative Examples 19 to 22 gave a pattern with a small roughness value, suggesting that this is due to excellent control of reflection of the exposure light because optical characteristics of the underlayer film thereof are near to the optimum values.

Pattern Etching Tests

Each of the afore-mentioned SOL-1 to SOL-5, SOL-9, and SOL-11 to SOL-15 was applied by spin coating onto a 300-mm diameter Si wafer substrate formed with a SiO₂ film having 200 nm thickness; and then, it was subjected to heat treatment at 250° C. for 60 seconds to form a resist underlayer film having 200 nm thickness. On it was applied an ArF silicon-containing resist middle layer film polymer SOG 1 prepared by an usual method; and then, it was subjected to heat treatment at 220° C. for 60 seconds to form a resist middle layer film having 35 nm thickness. On it was further applied an ArF resist upper layer film composition (PR-1); and then, it was subjected to heat treatment at 105° C. for 60 seconds to form a resist upper layer film having 100 nm thickness. On the resist upper layer film was applied an immersion top coat material (TC-1); and then, it was subjected to heat treatment at 90° C. for 60 seconds to form a top coat having 50 nm thickness.

Meanwhile, SOG 1, PR 1, and TC-1 used herein were the same as those mentioned before.

Then, after these were photo-exposed by using ArF immersion exposure instrument NSR-S610C (NA of 1.30, a of 0.98/0.65, 35-degree dipole s-polarized illumination, and 6% half tone phase shift mask, manufactured by Nikon Corp.), heat treatment (PEB) was done at 100° C. for 60 seconds, which was then followed by development with an aqueous tetramethyl ammonium hydroxide (TMAH) solution with the concentration thereof being 2.38% by mass for 30 seconds to obtain a positive line-and-space pattern with the pitch of 100 nm and the resist line width of 45 nm to 25 nm.

Then, by using dry etching instrument Telius (manufactured by Tokyo Electron Ltd.), processing of the silicon-containing middle layer film by using the resist pattern as a mask, processing of the underlayer film by using the silicon-containing middle layer film as a mask, and processing of the $SiO_2$ film by using the underlayer film as a mask were respectively done by dry etching.

The etching was done under the conditions shown below.

Transfer Condition of the Resist Pattern to the SOG Film:

| | |
|---|---|
| Chamber pressure | 10.0 Pa |
| RF power | 1,500 W |
| $CF_4$ gas flow rate | 15 sccm |
| $O_2$ gas flow rate | 75 sccm |
| Time | 15 seconds |

Transfer Condition of the SOG Film to the Underlayer Film:

| | |
|---|---|
| Chamber pressure | 2.0 Pa |
| RF power | 500 W |
| Ar gas flow rate | 75 sccm |
| $O_2$ gas flow rate | 45 sccm |
| Time | 120 seconds |

Transfer Condition to the $SiO_2$ Film:

| | |
|---|---|
| Chamber pressure | 2.0 Pa |
| RF power | 2,200 W |
| $C_5F_{12}$ gas flow rate | 20 sccm |
| $C_2F_6$ gas flow rate | 10 sccm |
| Ar gas flow rate | 300 sccm |
| $O_2$ gas flow rate | 60 sccm |
| Time | 90 seconds |

Cross sections of the obtained pattern observed by using electron microscope S-4800 (manufactured by Hitachi, Ltd.) are summarized in Table 6.

TABLE 6

| | Underlayer film composition | Pattern form after development | Middle layer film transfer etching form | Underlayer film transfer etching form | Substrate transfer etching form | Minimum size (nm) without pattern wiggling after substrate transfer etching |
|---|---|---|---|---|---|---|
| Example 16 | SOL-1 | Vertical form | Vertical form | Vertical form | Vertical form | 27 |
| Example 17 | SOL-2 | Vertical form | Vertical form | Vertical form | Vertical form | 26 |
| Example 18 | SOL-3 | Vertical form | Vertical form | Vertical form | Vertical form | 28 |
| Example 19 | SOL-4 | Vertical form | Vertical form | Vertical form | Vertical form | 29 |
| Example 20 | SOL-5 | Vertical form | Vertical form | Vertical form | Vertical form | 29 |
| Comparative Example 23 | SOL-9 | Vertical form | Vertical form | Vertical form | Vertical form | 26 |
| Comparative Example 24 | SOL-11 | Vertical form | Vertical form | Vertical form | Vertical form | 26 |
| Comparative Example 25 | SOL-12 | Vertical form | Vertical form | Vertical form | Vertical form | 31 |
| Comparative Example 26 | SOL-13 | Vertical form | Vertical form | Vertical form | Vertical form | 33 |
| Comparative Example 27 | SOL-14 | Vertical form | Vertical form | Vertical form | Vertical form | 33 |
| Comparative Example 28 | SOL-15 | Vertical form | Vertical form | Vertical form | Vertical form | 35 |

As shown in Table 6, by measuring size of the underlayer film pattern which was remained after substrate transfer, it was found that pattern wiggling occurred with the line width of 30 nm or more in the underlayer film having hardness of less than 0.80 GPa (Comparative Examples 25 to 28). On the other hand, it was found that there was no wiggling with the pattern size of less than 30 nm when the underlayer film having hardness of 0.80 GPa or more is used (Examples 16 to 20 and Comparative Examples 23 to 24).

As can be seen above, a resist underlayer film which is formed by using the resist underlayer film composition of the present invention has excellent filling-up properties because it can be formed by a spin coating method, desirable n-value and k-value as an antireflective film, has sufficient solvent resistance even with low PAB temperature, and has excellent wiggling resistance during etching; and thus, it was demonstrated that this resist underlayer film is extremely useful for a multilayer resist process, especially as a underlayer film for a three-layer resist process, in patterning with ultrafine and high precision.

On the other hand, Comparative Examples were in short of any one of these points.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A resist underlayer film composition, consisting essentially of:

a crosslinking agent:

an acid generator; and a polymer obtained by:

(A) condensation of one or more kinds of a compound shown by the following general formula (1-1) with one or more kinds of a compound shown by the following general formula (2-3) and an equivalent body thereof to form a condensed body, and (B) condensation of the condensed body obtained in (A) with one or more kinds of a compound shown by the following general formula (2-1), a compound shown by the following general formula (2-2), and an equivalent body thereof,

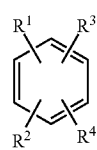

(1-1)

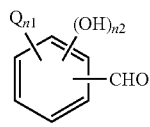

(2-1)

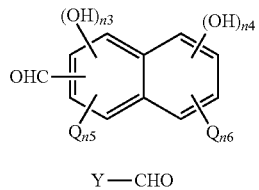

(2-2)

Y—CHO (2-3)

wherein each of $R^1$ to $R^4$ independently represents any of a hydrogen atom, a halogen atom, a hydroxyl group, an isocyanato group, a glycidyloxy group, a carboxyl group, an amino group, an alkoxyl group having 1 to 30 carbon atoms, an alkoxycarbonyl group having 1 to 30 carbon atoms, and an alkanoyloxy group having 1 to 30 carbon atoms, or an optionally substituted, saturated or unsaturated, organic group having 1 to 30 carbon atoms, wherein two substituents arbitrarily selected from each of $R^1$ to $R^4$ within a molecule may be bonded to form a cyclic substituent group: in the general formulae (2-1) and (2-2), Q represents an optionally substituted organic group having 1 to 30 carbon atoms, wherein two groups represented by Q arbitrarily selected within a molecule may be bonded to form a cyclic substituent group; n1 to n6 represent numbers of each substituent groups, while each of them represents an integer of 0 to 2: in the general formula (2-2), these numbers satisfy the relationships of $0 \leq n3+n5 \leq 3$, $0 \leq n4+n6 \leq 4$, and $0 \leq n3+n4 \leq 4$: and in the general formula (2-3), Y represents a hydrogen atom or an optionally substituted monovalent organic group having 1 to 30 carbon atoms, wherein (2-3) is different from (2-1) and (2-2).

2. The resist underlayer film composition according to claim 1, wherein the compound shown by the general formula (1-1) is a compound shown by the following general formula (1-2),

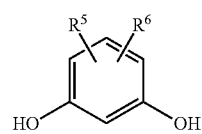

(1-2)

wherein each of $R^5$ and $R^6$ independently represents any of a hydrogen atom, a halogen atom, a hydroxyl group, an isocyanato group, a glycidyloxy group, a carboxyl group, an amino group, an alkoxyl group having 1 to 30 carbon atoms, an alkoxycarbonyl group having 1 to 30 carbon atoms, and an alkanoyloxy group having 1 to 30 carbon atoms, or an optionally substituted, saturated or unsaturated, organic group having 1 to 30 carbon atoms, wherein two substituents shown by $R^5$ and $R^6$ within a molecule may be bonded to form a cyclic substituent group.

3. The resist underlayer film composition according to claim 1, wherein the resist underlayer film composition further contains an organic solvent.

4. The resist underlayer film composition according to claim 2, wherein the resist underlayer film composition further contains an organic solvent.

5. A patterning process to form a pattern on a body to be processed, wherein, at least, a resist underlayer film is formed on a body to be processed by using the resist underlayer film composition according to claim 1, a resist middle layer film is formed on the resist underlayer film by using a silicon-containing resist middle layer film composition, a resist upper layer film is formed on the resist middle layer film by using a resist upper layer film composition which is a photoresist composition, a circuit pattern is formed on the resist upper layer film, the resist middle layer film is etched by using the resist upper layer film formed with the pattern as a mask, the resist underlayer film is etched by using the resist middle layer film formed with the pattern as a mask, and further, the body to be processed is etched by using the resist underlayer film formed with the pattern as a mask, whereby a pattern is formed on the body to be processed.

6. A patterning process to form a pattern on a body to be processed, wherein, at least, a resist underlayer film is formed on a body to be processed by using the resist underlayer film composition according to claim 4, a resist middle layer film is formed on the resist underlayer film by using a silicon-containing resist middle layer film composition, a resist upper layer film is formed on the resist middle layer film by using a resist upper layer film composition which is a photoresist composition, a circuit pattern is formed on the resist upper layer film, the resist middle layer film is etched by using the resist upper layer film formed with the pattern as a mask, the resist underlayer film is etched by using the resist middle layer film formed with the pattern as a mask, and further, the body to be processed is etched by using the resist underlayer film formed with the pattern as a mask, whereby a pattern is formed on the body to be processed.

7. A patterning process to form a pattern on a body to be processed, wherein, at least, a resist underlayer film is formed on a body to be processed by using the resist underlayer film composition according to claim 1, a resist middle layer film is formed on the resist underlayer film by using a silicon-containing resist middle layer film composition, an organic anti-reflective film (BARC) is formed on the resist middle layer film, a resist upper layer film is formed on the BARC by using a resist upper layer film composition which is a photoresist composition, thereby forming a four-layered resist film, a circuit pattern is formed on the resist upper layer film, the BARC and the resist middle layer film are etched by using the resist upper layer film formed with the pattern as a mask, the resist underlayer film is etched by using the resist middle layer film formed with the pattern as a mask, and further, the body to be processed is etched by using the resist underlayer film formed with the pattern as a mask, whereby a pattern is formed on the body to be processed.

8. A patterning process to form a pattern on a body to be processed, wherein, at least, a resist underlayer film is formed on a body to be processed by using the resist underlayer film composition according to claim 4, a resist middle layer film is formed on the resist underlayer film by using a silicon-containing resist middle layer film composition, an organic anti-reflective film (BARC) is formed on the resist middle layer film, a resist upper layer film is formed on the BARC by using a resist upper layer film composition which is a photoresist composition, thereby forming a four-layered resist film, a circuit pattern is formed on the resist upper layer film, the BARC and the resist middle layer film are etched by using the resist upper layer film formed with the pattern as a mask, the resist underlayer film is etched by using the resist middle layer film formed with the pattern as a mask, and further, the body to be processed is etched by using the resist underlayer film formed with the pattern as a mask, whereby a pattern is formed on the body to be processed.

9. A patterning process to form a pattern on a body to be processed, wherein, at least, a resist underlayer film is formed on a body to be processed by using the resist underlayer film composition according to claim 1, an inorganic hard mask middle layer film, selected from any of a silicon oxide film, a silicon nitride film, a silicon oxide nitride film, and an amorphous silicon film, is formed on the resist underlayer film, a resist upper layer film is formed on the inorganic hard mask middle layer film by using a resist upper layer film composition which is a photoresist composition, a circuit pattern is formed on the resist upper layer film, the inorganic hard mask middle layer film is etched by using the resist upper layer film formed with the pattern as a mask, the resist underlayer film is etched by using the inorganic hard mask middle layer film formed with the pattern as a mask, and further, the body to be processed is etched by using the resist underlayer film funned with the pattern as a mask, whereby a pattern is formed on the body to be processed.

10. A patterning process to form a pattern on a body to be processed, wherein, at least, a resist underlayer film is formed on a body to be processed by using the resist underlayer film composition according to claim 4, an inorganic hard mask middle layer film, selected from any of a silicon oxide film, a silicon nitride film, a silicon oxide nitride film, and an amorphous silicon film, is formed on the resist underlayer film, a resist upper layer film is formed on the inorganic hard mask middle layer film by using a resist upper layer film composition which is a photoresist composition, a circuit pattern is formed on the resist upper layer film, the inorganic hard mask middle layer film is etched by using the resist upper layer film formed with the pattern as a mask, the resist underlayer film is etched by using the inorganic hard mask middle layer film formed with the pattern as a mask, and further, the body to be processed is etched by using the resist underlayer film formed with the pattern as a mask, whereby a pattern is formed on the body to be processed.

11. A patterning process to form a pattern on a body to be processed, wherein, at least, a resist underlayer film is formed on a body to be processed by using the resist underlayer film composition according to claim 1, an inorganic hard mask middle layer film, selected from any of a silicon oxide film, a silicon nitride film, a silicon oxide nitride film, and an amorphous silicon film, is formed on the resist underlayer film, an organic antireflective film (BARC) is formed on the inorganic hard mask middle layer film, a resist upper layer film is formed on the BARC by using a resist upper layer film composition which is a photoresist composition, thereby forming a four-layered resist film, a circuit pattern is formed on the resist upper layer film, the BARC and the inorganic hard mask middle layer film are etched by using the resist upper layer film formed with the pattern as a mask, the resist underlayer film is etched by using the inorganic hard mask middle layer film formed with the pattern as a mask, and further, the body to be processed is etched by using the resist underlayer film formed with the pattern as a mask, whereby a pattern is formed on the body to be processed.

12. A patterning process to form a pattern on a body to be processed, wherein, at least, a resist underlayer film is formed on a body to be processed by using the resist underlayer film composition according to claim 4, an inorganic hard mask middle layer film, selected from any of a silicon oxide film, a silicon nitride film, a silicon oxide nitride film, and an amorphous silicon film, is formed on the resist underlayer film, an organic antireflective film (BARC) is formed on the inorganic hard mask middle layer film, a resist upper layer film is formed on the BARC by using a resist upper layer film composition which is a photoresist composition, thereby faulting a four-layered resist film, a circuit pattern is formed on the resist upper layer film, the BARC and the inorganic hard mask middle layer film are etched by using the resist upper layer film formed with the pattern as a mask, the resist underlayer film is etched by using the inorganic hard mask middle layer film formed with the pattern as a mask, and further, the body to be processed is etched by using the resist underlayer film formed with the pattern as a mask, whereby a pattern is formed on the body to be processed.

13. The patterning process according to claim 9, wherein the inorganic hard mask middle layer film is formed by a CVD method or an ALD method.

14. The patterning process according to claim 11, wherein the inorganic hard mask middle layer film is formed by a CVD method or an ALD method.

15. The patterning process according to claim 5, wherein after the resist underlayer film is formed, the said resist underlayer film is subjected to heat treatment at 250° C. or lower.

16. The patterning process according to claim 14, wherein after the resist underlayer film is formed, the said resist underlayer film is subjected to heat treatment at 250° C. or lower.

17. The patterning process according to claim 5, wherein the patterning process of the resist upper layer film is done by any of a photolithography method with a wavelength range of 10 nm or longer to 300 nm or shorter, a direct drawing method by an electron beam, and a nanoimprinting method, or by a combination of them.

18. The patterning process according to claim 16, wherein the patterning process of the resist upper layer film is done by any of a photolithography method with a wavelength range of 10 nm or longer to 300 nm or shorter, a direct drawing method by an electron beam, and a nanoimprinting method, or by a combination of them.

19. The patterning process according to claim 5, wherein a development method in the patterning process is an alkaline development or a development by an organic solvent.

20. The patterning process according to claim 18, wherein a development method in the patterning process is an alkaline development or a development by an organic solvent.

21. The patterning process according to claim 5, wherein the body to be processed is a semiconductor substrate comprising any of a metal film, a metal carbide film, a metal oxide film, a metal nitride film, or a metal oxynitride film.

22. The patterning process according to claim 20, wherein the body to be processed is a semiconductor substrate comprising any of a metal film, a metal carbide film, a metal oxide film, a metal nitride film, or a metal oxynitride film.

23. The patterning process according to claim 21, wherein the metal is any of silicon, titanium, tungsten, hafnium, zirconium, chromium, germanium, copper, aluminum, and iron, or an alloy of these metals.

24. The patterning process according to claim 22, wherein the metal is any of silicon, titanium, tungsten, hafnium, zirconium, chromium, germanium, copper, aluminum, and iron, or an alloy of these metals.

* * * * *